(12) United States Patent
Okumura

(10) Patent No.: US 11,177,350 B2
(45) Date of Patent: Nov. 16, 2021

(54) INSULATED-GATE SEMICONDUCTOR DEVICE AND METHOD OF MANUFACTURING THE SAME

(71) Applicant: FUJI ELECTRIC CO., LTD., Kawasaki (JP)

(72) Inventor: Keiji Okumura, Matsumoto (JP)

(73) Assignee: FUJI ELECTRIC CO., LTD., Kawasaki (JP)

(*) Notice: Subject to any disclaimer, the term of this patent is extended or adjusted under 35 U.S.C. 154(b) by 47 days.

(21) Appl. No.: 16/844,113

(22) Filed: Apr. 9, 2020

(65) Prior Publication Data
US 2020/0235210 A1 Jul. 23, 2020

Related U.S. Application Data

(62) Division of application No. 16/661,925, filed on Oct. 23, 2019, now Pat. No. 10,672,874, which is a (Continued)

(30) Foreign Application Priority Data

Dec. 11, 2017 (JP) .............................. JP2017-237033

(51) Int. Cl.
*H01L 29/78* (2006.01)
*H01L 29/10* (2006.01)
(Continued)

(52) U.S. Cl.
CPC ........ *H01L 29/1095* (2013.01); *H01L 29/083* (2013.01); *H01L 29/0865* (2013.01);
(Continued)

(58) Field of Classification Search
CPC ........... H01L 29/4236; H01L 29/66348; H01L 29/7813; H01L 29/7811
See application file for complete search history.

(56) References Cited

U.S. PATENT DOCUMENTS 9,741,712 B2 8/2017 Rupp et al.
9,837,527 B2 12/2017 Siemieniec et al.
(Continued)

FOREIGN PATENT DOCUMENTS

| JP | 2016122835 A | 7/2016 |
|---|---|---|
| JP | 2016163047 A | 9/2016 |
| JP | 6105032 B2 | 3/2017 |

OTHER PUBLICATIONS

Notice of Allowance dated Aug. 9, 2019 in co-pending U.S. Appl. No. 16/170,530.
(Continued)

*Primary Examiner* — Douglas M Menz

(57) ABSTRACT

An insulated-gate semiconductor device, which has trenches arranged in a chip structure, the trenches defining both sidewalls in a first and second sidewall surface facing each other, includes: a first unit cell including a main-electrode region in contact with a first sidewall surface of a first trench, a base region in contact with a bottom surface of the main-electrode region and the first sidewall surface, a drift layer in contact with a bottom surface of the base region and the first sidewall surface, and a gate protection-region in contact with the second sidewall surface and a bottom surface of the first trench; and a second unit cell including an operation suppression region in contact with a first sidewall surface and a second sidewall surface of a second trench, wherein the second unit cell includes the second trench located at one end of an array of the trenches.

4 Claims, 18 Drawing Sheets

Related U.S. Application Data division of application No. 16/170,530, filed on Oct. 25, 2018, now Pat. No. 10,490,633.

(51) Int. Cl.
| | |
|---|---|
| *H01L 29/739* | (2006.01) |
| *H01L 29/08* | (2006.01) |
| *H01L 29/423* | (2006.01) |
| *H01L 29/417* | (2006.01) |
| *H01L 29/66* | (2006.01) |
| *H01L 29/16* | (2006.01) |
| *H01L 29/745* | (2006.01) |
| *H01L 21/04* | (2006.01) |
| *H01L 29/06* | (2006.01) |
| *H01L 29/04* | (2006.01) |

(52) U.S. Cl.
CPC ........ *H01L 29/1608* (2013.01); *H01L 29/417* (2013.01); *H01L 29/4236* (2013.01); *H01L 29/66068* (2013.01); *H01L 29/66348* (2013.01); *H01L 29/7397* (2013.01); *H01L 29/745* (2013.01); *H01L 29/7806* (2013.01); *H01L 29/7811* (2013.01); *H01L 29/7813* (2013.01); *H01L 21/047* (2013.01); *H01L 21/049* (2013.01); *H01L 21/0465* (2013.01); *H01L 21/0475* (2013.01); *H01L 29/045* (2013.01); *H01L 29/0696* (2013.01)

(56) References Cited

U.S. PATENT DOCUMENTS

| | | |
|---|---|---|
| 9,997,515 B2 | 6/2018 | Rupp et al. |
| 2016/0163852 A1 | 6/2016 | Siemieniec et al. |
| 2016/0260709 A1 | 9/2016 | Rupp et al. |
| 2017/0077251 A1 | 3/2017 | Aichinger et al. |
| 2017/0345818 A1 | 11/2017 | Rupp et al. |
| 2018/0053841 A1 | 2/2018 | Siemieniec et al. |

OTHER PUBLICATIONS

Notice of Allowance dated Jan. 27, 2020 in co-pending U.S. Appl. No. 16/661,925.

INSULATED-GATE SEMICONDUCTOR DEVICE AND METHOD OF MANUFACTURING THE SAME

CROSS-REFERENCE TO RELATED APPLICATIONS

This application is a divisional of U.S. application Ser. No. 16/661,925, filed Oct. 23, 2019, which is a divisional of U.S. application Ser. No. 16/170,530, filed Oct. 25, 2018, which claims benefit of priority under 35 USC 119 based on Japanese Patent Application No. 2017-237033 filed on Dec. 11, 2017, the entire contents of which are incorporated by reference herein.

TECHNICAL FIELD

The present invention relates to an insulated-gate semiconductor device having an insulated-gate electrode structure in a trench and a method of manufacturing the same.

BACKGROUND

In a trench gate MOS field effect transistor (MOSFET), as compared with a planer gate MOSFET, reduction of on-resistance due to reduction of cell pitch can be expected. In a trench gate MOSFET using a wide band gap semiconductor such as silicon carbide (SiC) as a material, structures using an a-plane (11-20) on a sidewall surface of a trench have been proposed (refer to US 2017/0,077,251 A (Patent Literature 1), JP 6105032 B2 (Patent Literature 2), and JP 2016-163047 A (Patent Literature 3)). In Patent Literatures 1 to 3, an n-type source region and a p-type base region are provided on one sidewall surface of a trench, and the sidewall surface is used as a current path.

In an insulated-gate semiconductor device such as a trench gate MOSFET using a wide band gap semiconductor as a material, further improvement of the structure of the insulated-gate semiconductor device and the method of manufacturing the insulated-gate semiconductor device is required.

SUMMARY

In view of the above problems, an object of the invention is to provide an insulated-gate semiconductor device capable of further improving the insulated-gate semiconductor device and a method of manufacturing the same.

An aspect of the present invention inheres in an insulated-gate semiconductor device having a plurality of trenches arranged in a chip structure, the plurality of trenches defining both sidewalls in a first sidewall surface having a first inclination angle with respect to a reference plane of the chip structure and a second sidewall surface facing the first sidewall surface and having a second inclination angle different from the first inclination angle with respect to the reference plane, including: a first unit cell provided with an insulated-gate electrode structure in a first trench included in the plurality of trenches and including a first conductivity type main-electrode region being in contact with a first sidewall surface of the first trench, a second conductivity type base region being in contact with a bottom surface of the main-electrode region and the first sidewall surface, a first conductive type drift layer being in contact with a bottom surface of the base region and the first sidewall surface and having an impurity concentration lower than that of the main-electrode region, and a second conductivity type gate protection-region being in contact with the second sidewall surface and a bottom surface of the first trench and having an impurity concentration higher than that of the base region; and a second unit cell provided with an insulated-gate electrode structure in a second trench included in the plurality of trenches and including a second conductivity type operation suppression region being buried in an upper portion of the drift layer, being in contact with a first sidewall surface and a second sidewall surface of the second trench, and having an impurity concentration higher than that of the base region, wherein the second unit cell is arranged so as to include the second trench located at one end of an array of the plurality of trenches.

Another aspect of the present invention inheres in a method of an insulated-gate semiconductor device encompassing: a plurality of unit cells, the unit cell including: an insulated-gate electrode structure arranged inside a trench defining both sidewalls in a first sidewall surface having a first inclination angle with respect to a reference plane of a chip structure and a second sidewall surface facing the first sidewall surface and having a second inclination angle different from the first inclination angle with respect to the reference plane; a first conductivity type main-electrode region being in contact with a first sidewall surface of the trench; a second conductivity type base region being in contact with a bottom surface of the main-electrode region and the first sidewall surface; a first conductivity type drift layer being in contact with a bottom surface of the base region and the first sidewall surface and having an impurity concentration lower than that of the main-electrode region; a second conductivity type gate protection-region being in contact with the second sidewall surface and a bottom surface of the trench and having an impurity concentration higher than that of the base region; and a main electrode being in contact with the main-electrode region, wherein a Schottky barrier diode implemented by the drift layer and the main electrode located between the adjacent unit cells is embedded.

Further aspect of the present invention inheres in a method of an insulated-gate semiconductor device encompassing: an insulated-gate electrode structure arranged inside a trench defining both sidewalls in a first sidewall surface having a first inclination angle with respect to a reference plane of a chip structure and a second sidewall surface facing the first sidewall surface and having a second inclination angle different from the first inclination angle with respect to the reference plane; a first conductivity type main-electrode region being in contact with a first sidewall surface of the trench and having a high impurity concentration; a second conductivity type base region being in contact with a bottom surface of the main-electrode region and the first sidewall surface; a first conductivity type drift layer being in contact with a bottom surface of the base region and the first sidewall surface and having an impurity concentration lower than that of the main-electrode region; a second conductivity type gate protection-region being in contact with the second sidewall surface and a bottom surface of the trench and having an impurity concentration higher than that of the base region; and a second conductivity type base-contact region being in contact with the gate protection-region while being separated from the trench and having an impurity concentration higher than that of the base region.

Still further aspect of the present invention inheres in a method of an insulated-gate semiconductor device encompassing a plurality of stripe-shaped unit cells arranged, the unit cell including: a first conductivity type drift layer; a second conductivity type base region provided on the drift layer; a first conductivity type main-electrode region provided in an upper portion of the base region and having an impurity concentration higher than that of the drift layer; an insulated-gate electrode structure provided inside a stripe-shaped trench so that one sidewall surface is in contact with the main-electrode region and the base region; and a second conductivity type gate protection-region provided in a stripe shape on the drift layer so as to be in contact with a bottom surface and the other sidewall surface of the trench and having an impurity concentration higher than that of the base region, wherein a structure of interposing the common base region between the trenches of adjacent unit cells and a structure of interposing the common gate protection-region between the trenches of adjacent unit cells are alternately repeated, and the gate protection-regions are intermittently arranged along a longitudinal direction of the trench.

Still further aspect of the present invention inheres in a method of an insulated-gate semiconductor device encompassing: forming a second conductivity type base region on a first conductivity type drift layer; forming a first conductivity type main-electrode region having an impurity concentration higher than that of the drift layer in an upper portion of the base region; forming a trench defining both sidewalls in a first sidewall surface having a first inclination angle with respect to a reference plane of a chip structure with the main-electrode region being formed and a second sidewall surface facing the first sidewall surface and having a second inclination angle different from the first inclination angle with respect to the reference plane until reaching the drift layer and exposing the main-electrode region and the base region to the first sidewall surface; forming a second conductivity type gate protection-region being in contact with a bottom surface and the first sidewall surface of the trench by performing ion implantation obliquely on a bottom surface and the first sidewall surface of the trench; and forming an insulated-gate electrode structure inside the trench.

DETAILED DESCRIPTION

Figure 1:
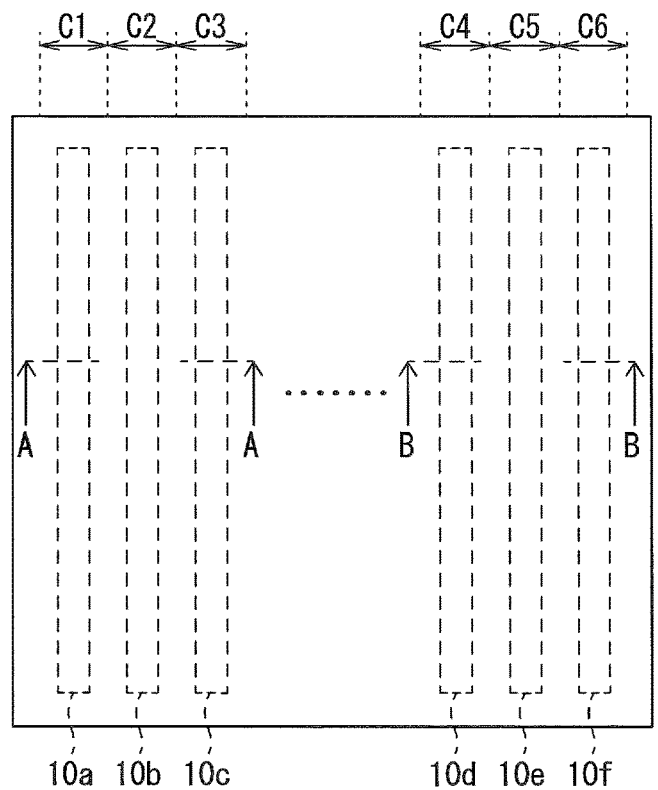
FIG. 1 is a plan view illustrating an example of an insulated-gate semiconductor device according to a first embodiment.

With reference to the Drawings, a first to fourth embodiments of the present invention will be described below. In the Specification and the Drawings, the same or similar elements are indicated by the same or similar reference numerals. The drawings are schematic, and it should be noted that the relationship between thickness and planer dimensions, the thickness proportion of each layer, and the like are different from real ones. Accordingly, specific thicknesses or dimensions should be determined with reference to the following description. Moreover, in some drawings, portions are illustrated with different dimensional relationships and proportions. The embodiments described below merely illustrate schematically semiconductor devices for specifying and giving shapes to the technical idea of the present invention, and the span of the technical idea is not limited to materials, shapes, structures, and relative positions of elements described herein.

In the Specification, a "first main-electrode region" is assigned to a semiconductor region which will be a source region or a drain region in a field-effect transistor (FET) or a static induction transistor (SIT), an emitter region or a collector region in an insulated-gate bipolar transistor (IGBT) and an anode region or a cathode region in a static induction (SI) thyristor or a gate turn-off (GTO) thyristor. A "second main-electrode region" is assigned to a semiconductor region which will not be the first main-electrode region and will be the source region or the drain region in the FET or the SIT, the emitter region or the collector region in the IGBT, and the anode region or the cathode region in the SI thyristor or the GTO thyristor. That is, when the first main-electrode region is the source region, the second main-electrode region means the drain region. When the first main-electrode region is the emitter region, the second main-electrode region means the collector region. When the first main-electrode region is the anode region, the second main-electrode region means the cathode region. In some appropriate cases such as MOSFET, a function of the first main-electrode region and a function of the second main-electrode region are exchangeable each other by exchanging a bias relationship if the structure of the subject semiconductor device is symmetric. Furthermore, a "main-electrode region" is described in the Specification, the main-electrode region comprehensively means any one of the first main-electrode region and the second main-electrode region.

In addition, in the following description, the definition of the directions such as up and down is merely provided for the convenience of description and does not limit the technical idea of the invention. For example, when an object is rotated by 90° and observed, the direction will be read by changing the up and down to the left and right; and when an object is rotated by 180° and observed, the direction will be read by inverting the up and down. In addition, in the following description, a case where the first conductivity type is n-type and the second conductivity type is p-type will be exemplarily described. However, the conductivity types may be selected in an inverse relationship, so that the first conductivity type may be p-type and the second conductivity type may be n-type. In addition, "+" or "−" attached to "n" or "p" denote that a semiconductor region has a relatively high or low impurity concentration as compared with a semiconductor region to which "+" and "−" are not attached. However, even semiconductor regions attached with the same "n" and "n" do not denote that the impurity densities of the respective semiconductor regions are strictly the same. In addition, in the following description, it is technically and logically obvious that members or regions doped with limitations of the "first conductivity type" and "second conductivity type" denote members or regions made of semiconductor materials without particular limitation. In addition, in this specification, in the Miller index notation, "−" denotes a bar attached to the index following the Miller index, and a negative sign is represented by attaching "−" before the index.

As illustrated in FIG. 1, the insulated-gate semiconductor device (MISFET) according to the first embodiment has a chip structure including an array of a plurality of unit cells C1 to C3, . . . C4 to C6, each of which includes a plurality of trenches 10a to 10c, . . . , 10d to 10f having the same shape. In addition, in the insulated-gate semiconductor device according to the first embodiment, the number of trenches and the number of unit cells are not particularly limited. The insulated-gate semiconductor device according to the first embodiment can be implemented as a power semiconductor device (power device) for flowing a large current by forming a multi-channel structure by further arranging a plurality of unit cells.

In FIG. 1, the planar patterns of the trenches 10a to 10c, . . . , 10d to 10f are schematically illustrated by broken lines. The trenches 10a to 10c, . . . , 10d to 10f are in a stripe shape and extend parallel to each other. In a direction (parallel direction of the trenches 10a to 10c, . . . , 10d to 100 perpendicular to the longitudinal direction of the trenches 10a to 10c, . . . , 10d to 10f, the unit cells C1 to C3 are located in the left peripheral portion of the array structure, and the unit cell C1 is located at one end of the array structure. In addition, the unit cells C4 to C6 are located in the right peripheral portion of the array structure, and the unit cell C6 is located at the other end of the array structure.

Figure 2:
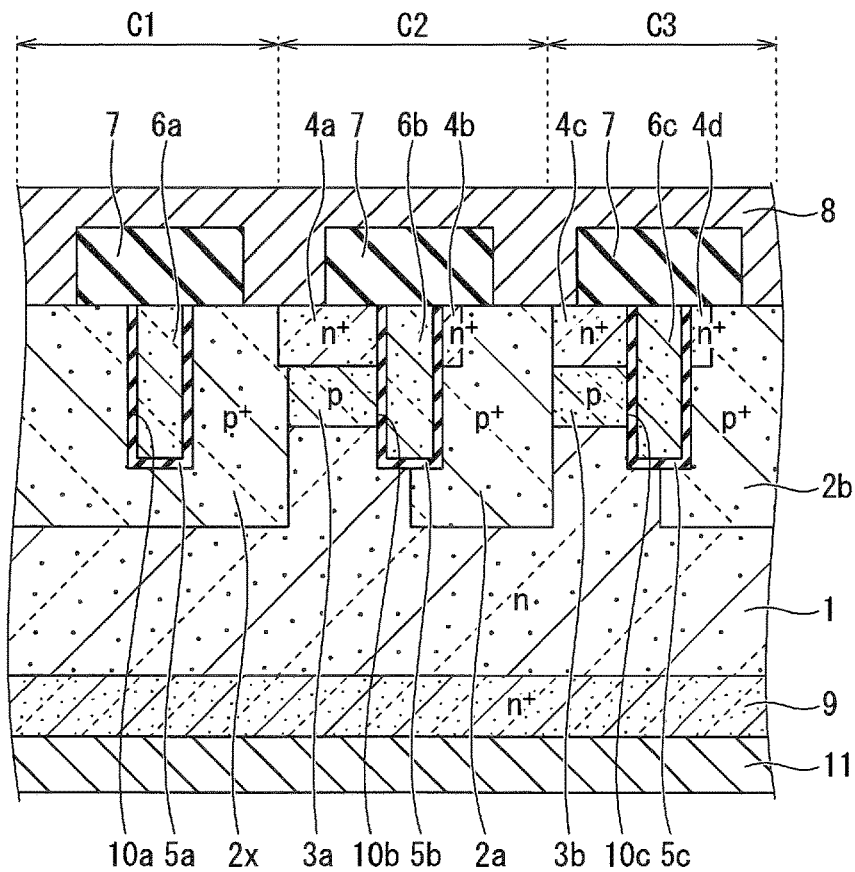
FIG. 2 is a vertical cross-sectional view of the insulated-gate semiconductor device according to the first embodiment taken from the A-A direction in FIG. 1.

A vertical cross-sectional view of the unit cells C1 to C3 in the left peripheral portion illustrated in FIG. 1 taken from the A-A direction corresponds to FIG. 2. As illustrated in FIG. 2, the insulated-gate semiconductor device according to the first embodiment includes a first conductivity type (n-type) drift layer 1 and second conductivity type (p-type) base regions 3a and 3b arranged on the drift layer 1. Each of the drift layer 1 and the base regions 3a and 3b is implemented by an epitaxial growth layer made of SiC.

$n^+$-type first main-electrode regions (source regions) 4a to 4d having an impurity concentration higher than that of the drift layer 1 are selectively provided in upper portions of the base regions 3a and 3b. The source regions 4a and 4c are in contact with the base regions 3a and 3b, respectively. In addition, since the source regions 4b and 4d are not used as current paths, the source regions 4b and 4d may not be provided. $p^+$-type gate protection-regions 2a and 2b having an impurity concentration higher than that of the base regions 3a and 3b are selectively provided on the drift layer 1. The upper surfaces of the gate protection-regions 2a and 2b are located at the same horizontal level as the upper surfaces of the source regions 4a to 4d. The gate protection-region 2a is in contact with the source regions 4b and 4c and the base region 3b.

Trenches 10a to 10c are provided so as to extend from the upper surfaces of the source regions 4a to 4d and reach the drift layer 1. In FIG. 2, the case where both sidewall surfaces of the trenches 10a to 10c are parallel in the vertical direction is exemplified, but the sidewall surfaces of the trenches 10a to 10c are not limited to be parallel in the vertical direction. For example, both sidewall surfaces of the trenches 10a to 10c may be inclined so as to be tapered downward. In addition, although the case where the bottom surfaces of the trenches 10a to 10c are flat is exemplified, but the bottom surfaces may be curved surfaces or corner portions of the bottom surfaces may have curvatures.

One sidewall surface (first sidewall surface described later) of the trench 10b is in contact with the source region 4a and the base region 3a, and the other sidewall surface (second sidewall surface described later) is in contact with the source region 4b and the gate protection-region 2b. One sidewall surface of the trench 10d is in contact with the source region 4c and the base region 3b, and the other sidewall surface is in contact with the source region 4d and the gate protection-region 2b. Although the case where the bottom surfaces of the trenches 10b and 10d are in contact with the drift layer 1 and the gate protection-regions 2a and 2b, respectively, is exemplified, all the bottom surfaces of the trenches 10b and 10d may be covered with the gate protection-regions 2a and 2b, respectively. On the other hand, both sidewall surfaces and the bottom surface of the trench 10a are covered with a p$^+$-type operation suppression region 2x. The operation suppression region 2x is in contact with the source region 4a and the base region 3a. The operation suppression region 2x is provided at the same depth as the gate protection-regions 2a and 2b.

Gate insulating films 5a to 5c are provided on the bottom surfaces and the sidewall surfaces of the trenches 10a to 10c. As the gate insulating films 5a to 5c, in addition to a silicon oxide film ($SiO_2$ film), there may be adopted a single layer film of any one of a silicon oxynitride (SiON) film, a strontium oxide (SrO) film, a silicon nitride ($Si_3N_4$) film, an aluminum oxide ($Al_2O_3$) film, a magnesium oxide (MgO) film, an yttrium oxide ($Y_2O_3$) film, a hafnium oxide ($HfO_2$) film, a zirconium oxide ($ZrO_2$) film, a tantalum oxide ($Ta_2O_5$) film, and a bismuth oxide ($Bi_2O_3$) film or a composite film obtained by laminating a plurality of these films.

Gate electrodes 6a to 6c are buried inside the trenches 10a to 10c with gate insulating films 5a to 5c interposed, so that an insulated-gate electrode structure (5a, 6a; 5b, 6b; 5c, 6c) is implemented. As the material of the gate electrodes 6a to 6c, for example, a polysilicon layer (doped polysilicon layer) which is doped with impurities such as phosphorus (P) at a high impurity concentration may be used.

A first main electrode (source electrode) 8 is arranged on the gate electrodes 6a to 6c with an interlayer insulating film 7 interposed. As the interlayer insulating film 7, there may be adopted a non-doped silicon oxide film ($SiO_2$ film) not containing phosphorus (P) or boron (B), which is called "NSG". However, as the interlayer insulating film 7, there may be adopted a phosphosilicate glass (PSG) film, a borosilicate glass (BSG) film, a borophosphosilicate glass (BPSG) film, a silicon nitride ($Si_3N_4$) film, or the like. The source electrode 8 is electrically connected to the source regions 4a and 4c and the gate protection-regions 2a and 2b.

The source electrode 8 is arranged separately from the gate surface electrode (not illustrated) located at the back of the paper surface.

For example, the source electrode 8 may be implemented by an aluminum (Al) film. As the gate surface electrode, the same material as the source electrode 8 may be used. Although not illustrated, a source contact layer and a barrier metallic layer serving as underlying metal may be arranged under the source electrode 8. For example, the source contact layer may be implemented by a nickel silicide ($NiSi_x$) film, and the barrier metallic layer may be implemented by a titanium nitride (TiN) film.

On the bottom surface of the drift layer 1, an n$^+$-type second main-electrode region (drain region) 9 is arranged so as to be in contact with the drift layer 1. The drain region 9 is implemented by a semiconductor substrate (SiC substrate) made of SiC. A second main electrode (drain electrode) 11 is arranged on the bottom surface of the drain region 9. As the drain electrode 11, there may be used, for example, a single layer film made of gold (Au) or a metal film laminated in the order of Al, nickel (Ni), and Au, and a metal film such as molybdenum (Mo) or tungsten (W) or an alloy layer obtained by depositing nickel (Ni) and titanium (Ti) and reacting with SiC may be further laminated at the lowermost layer of the single layer film or the metal film.

Figure 3:
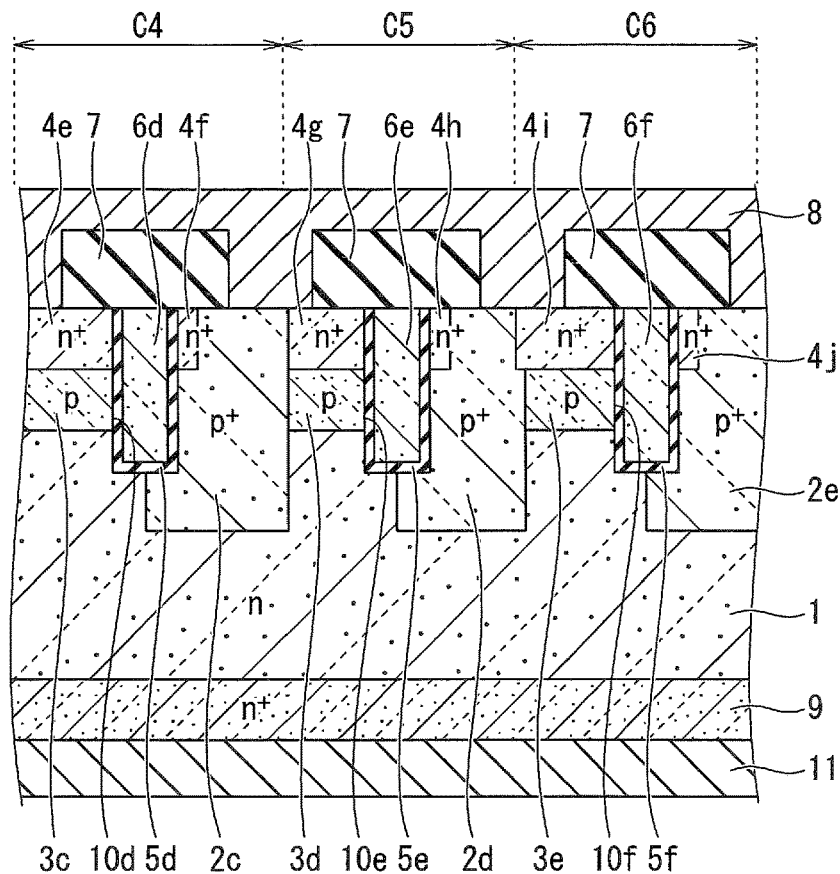
FIG. 3 is a vertical cross-sectional view of the insulated-gate semiconductor device according to the first embodiment taken from the B-B direction in FIG. 1.

On the other hand, a vertical cross cross-sectional view of the unit cells C4 to C6 located in the right peripheral portion illustrated in FIG. 1 taken from the B-B direction corresponds to FIG. 3. As illustrated in FIG. 3, p-type base regions 3c to 3e are arranged on the n-type drift layer 1. n$^+$-type source regions 4e to 4j are selectively provided in upper portions of the base regions 3c to 3e. The source regions 4e, 4g, and 4h are in contact with the base regions 3c to 3e, respectively. In addition, since the source regions 4f, 4h, and 4j are not used as current paths, the source regions 4f, 4h, and 4j may not be provided. p$^+$-type gate protection-regions 2c to 2e are selectively provided on the drift layer 1. The upper surfaces of the gate protection-regions 2c to 2e are located at the same horizontal level as the upper surfaces of the source regions 4e to 4j. The gate protection-region 2c is in contact with the source region 4g and the base region 3d. The gate protection-region 2d is in contact with the source region 4i and the base region 3e.

Trenches 10d to 10f are provided so as to extend from the upper surfaces of the source regions 4e to 4j and reach the drift layer 1. One sidewall surface of the trench 10d is in contact with the source region 4e and the base region 3c, and the other sidewall surface is in contact with the source region 4f and the gate protection-region 2c. One sidewall surface of the trench 10e is in contact with the source region 4g and the base region 3d, and the other sidewall surface is in contact with the source region 4h and the gate protection-region 2d. One sidewall surface of the trench 10f is in contact with the source region 4i and the base region 3e, and the other sidewall surface is in contact with the source region 4j and the gate protection-region 2e. Although the case where the bottom surfaces of the trenches 10d to 10f are in contact with the drift layer 1 and the gate protection-regions 2c to 2e, respectively, is exemplified, all the bottom surfaces of the trenches 10d to 10f may be covered with the gate protection-regions 2c to 2e, respectively.

The gate electrodes 6d to 6f are buried inside the trenches 10d to 10f through the gate insulating films 5d to 5f to implement insulated-gate electrode structures (5d, 6d), (5e, 6e), and (5f, 6f). A source electrode 8 is arranged on the gate electrodes 6d to 6f with an interlayer insulating film 7 interposed. The source electrode 8 is electrically connected to the source regions 4e, 4g, and 4h and the gate protection-regions 2c to 2e. An n+-type drain region 9 is arranged on the bottom surface of the drift layer 1 so as to be in contact with the drift layer 1. A drain electrode 11 is arranged on the bottom surface of the drain region 9.

Figure 4:
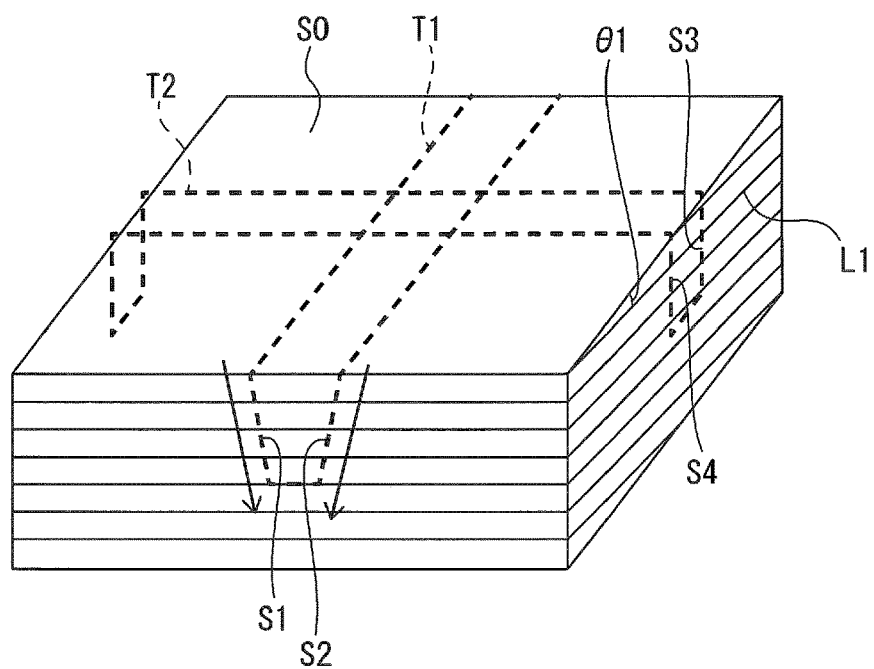
FIG. 4 is a schematic view for describing a plane orientation of a sidewall surface of a trench.

The plane orientation to be used for the sidewall surfaces of the trenches 10a to 10c, . . . , 10d to 10f illustrated in FIGS. 1 to 3 will be described with reference to FIGS. 4 to 6. As illustrated in FIG. 4, the chip structure in which the trenches 10a to 10c, . . . , 10d to 10f illustrated in FIGS. 1 to 3 are formed has, for example, an off angle θ1 of about 4° to 8° in the <11-20> direction with respect to <0001> direction (c-axis). The off angle θ1 is an angle defined by a plane (base plane) perpendicular to the c-axis which is the (0001) plane (Si plane) or (000-1) plane (C plane) and a reference plane of the chip structure. A straight line L1 indicated by a plurality of solid lines on the side surface of the chip structure schematically illustrates an Si plane. It is considered that a trench T1 and a trench T2 perpendicular to the trench T1 are provided in this chip structure. As the sidewall surfaces S1 and S2 of the trench T1, an m-plane which is a (1-100) plane perpendicular to the (0001) plane is used. Since the sidewall surfaces S1 and S2 of the trench T1 are actually formed in a tapered shape, all the sidewall surfaces S1 and S2 of the trench T1 are m-planes inclined by about 9° to the Si plane side.

Figure 5:
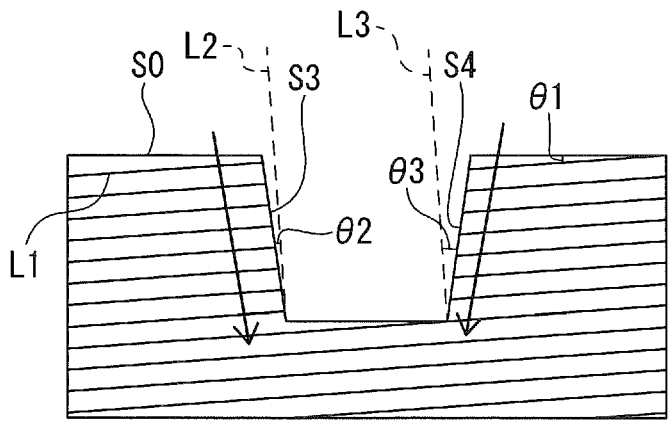
FIG. 5 is a schematic view for describing the plane orientation of the sidewall surface of the trench.
Figure 6:
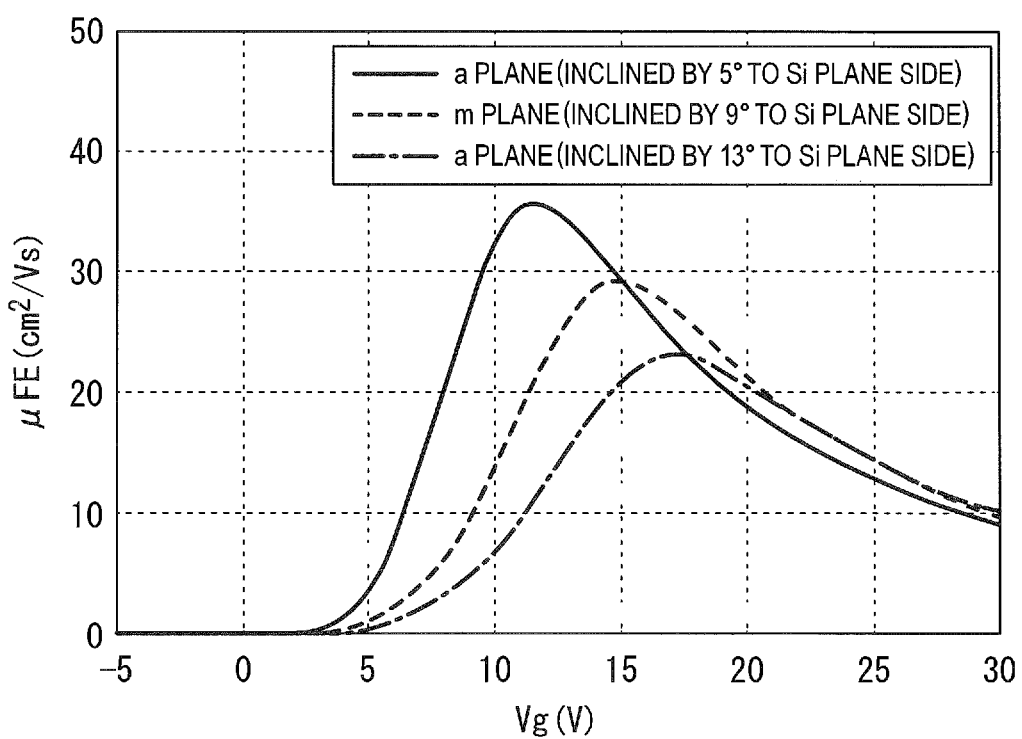
FIG. 6 is a graph illustrating a relationship among the plane orientation of the sidewall surface of the trench, a gate voltage, and mobility.

FIG. 5 illustrates a case where the trench T2 is provided in the chip structure. As illustrated in FIG. 5, as all the facing sidewall surfaces S3 and S4 of the trench T2, an a-plane which is the (11-20) plane is used. In FIG. 5, broken lines L2 and L3 parallel to the a-plane are schematically illustrated. In this case, since the semiconductor wafer has the off angle θ1, the inclination angle θ2 of one sidewall surface S3 of the trench T2 with respect to the a-plane is different from the inclination angle θ3 of the other sidewall surface S4 with respect to the a-plane. For example, in a case where the off angle θ1 is 4°, the inclination angle θ2 of the sidewall surface S3 of the trench T2 on the Si plane side with respect to the a-plane is 5°, and the inclination angle θ4 of the sidewall surface S4 of the trench T2 on the Si plane side with respect to the a-plane is 13°. FIG. 6 illustrates the relationship between the gate voltage and the electron mobility for the m-plane inclined by 9° to the Si plane side, the a-plane inclined by 5° to the Si plane side, and the a-plane inclined by 13° to the Si plane side. Referring to FIG. 6, the electron mobility is heightened in the order of the a-plane inclined by 5° to the Si plane side, the m-plane inclined by 9° to the Si plane side, and the a-plane inclined by 13° to the Si plane side.

In the insulated-gate semiconductor device according to the first embodiment, as the sidewall surfaces of the trenches 10b to 10c, . . . , 10d to 10f illustrated in FIGS. 1 to 3 which are in contact with the source regions 4a, 4c, 4e, 4g, and 4i and the base regions 3a to 3e, the a-plane having a relatively small inclination angle θ2 to the Si plane side and a high electron mobility is used as a current path. This a-plane is defined as a "first sidewall surface" having a first inclination angle θ2 with respect to the reference plane (a-plane) of the chip structure.

On the other hand, as the sidewall surfaces of the trenches 10b to 10c, . . . , 10d to 10f illustrated in FIGS. 1 to 3 which are in contact with the source regions 4b, 4d, 4f, 4h and 4j and the gate protection-regions 2a to 2e, the a-plane having a relatively large inclination angle θ3 to the Si plane side and a low electron mobility is used. The a-plane is defined as a low "second sidewall surface" facing the first sidewall surface, having a second inclination angle θ3 different from the first inclination angle θ2 with respect to the reference plane (a-plane), having an electron mobility lower than that of the first sidewall surface. In this manner, both sidewalls of the trenches 10b to 10c, . . . , 10d to 10f are defined as a "first sidewall surface" and a "second sidewall surface".

At the time of the operation of the insulated-gate semiconductor device according to the first embodiment, a positive voltage is applied to the drain electrode 11, and a positive voltage equal to or higher than a threshold value is applied to the gate electrodes 6a to 6f. As a result, in the unit cells C2 to C6 excluding the unit cell C1 located at one end of the array structure of the unit cells C1 to C3, . . . , C4 to C6, inversion layers (channels) are formed on the sides of the base regions 3a to 3e closer to the gate electrodes 6b to 6f, so that the transistor is be turned on. In the turned-on state, a current flows from the drain electrode 11 to the source electrode 8 through the drain region 9, the drift layer 1, the inversion layers of the base regions 3a to 3e, and the source regions 4a, 4c, 4e, 4g and 4i. On the other hand, in a case where the voltage applied to the gate electrodes 6a to 6f is lower than the threshold value, since no inversion layer is formed in the base regions 3a to 3e, the transistor is turned off, and thus, no current flows from the drain electrode 11 to the source electrode 8. On the other hand, in the unit cell C1 located at one end of the array structure of the unit cells C1 to C3, . . . , C4 to C6, the both sidewall surfaces and the bottom surface of the trench 10a are covered with the operation suppression region 2x. Therefore, at the time of operation of the insulated-gate semiconductor device according to the first embodiment, the operation of the unit cell C1 is suppressed.

In the unit cell C1 located at the end of the array structure of the unit cells C1 to C3, . . . , C4 to C6, the pattern of the trench 10a is relatively easily collapsed. On the other hand, according to the insulated-gate semiconductor device of the first embodiment, in the unit cell C1 located at the end of the array structure of the unit cells C1 to C3, . . . , C4 to C6, the bottom and both sidewall surfaces of the trench 10a and are covered with the p+-type operation suppression region 2x. As a result, even in a case where the pattern of the trench 10a is collapsed, since the operation of the unit cell C1 is suppressed, the reliability can be improved.

Figure 7:
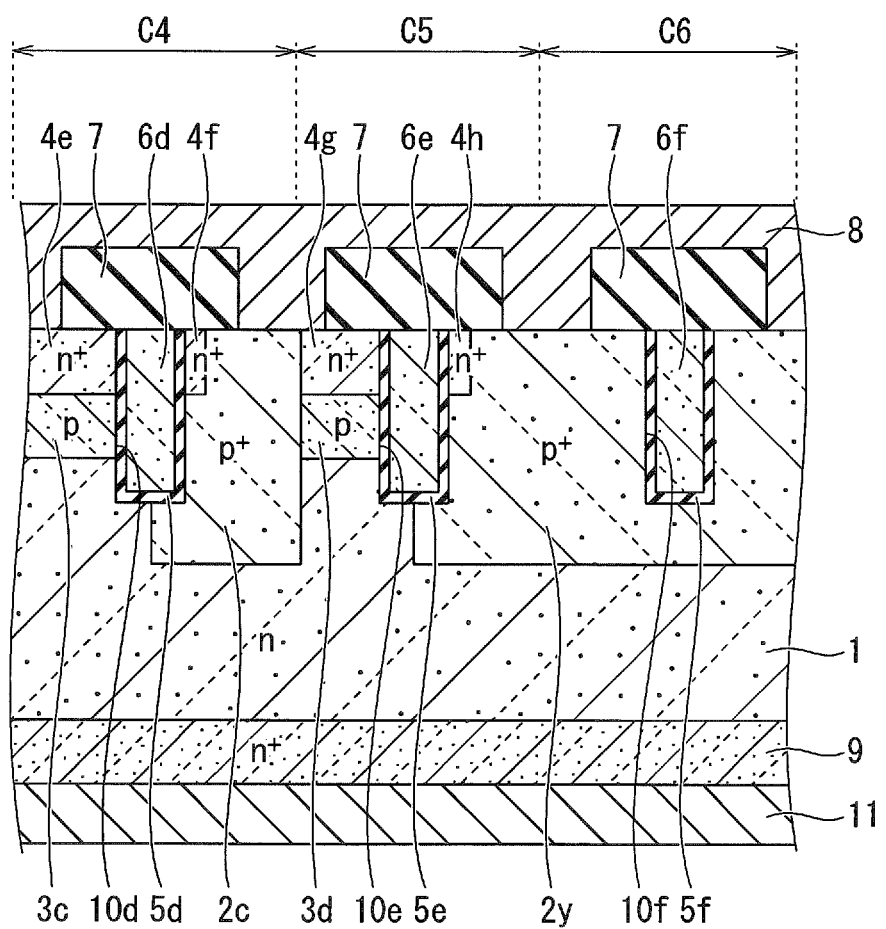
FIG. 7 is a cross-sectional view of main components illustrating another example of the insulated-gate semiconductor device according to the first embodiment.

In addition, as illustrated in FIG. 7, also in the unit cell C6 located at the other end of the array structure of the unit cells C1 to C3, . . . , C4 to C6, the bottom and both sidewall surfaces of the trench 10f may be covered with a p+-type operation suppression region 2y. The operation suppression region 2y is in contact with the bottom and the sidewall surface of the trench 10e of the unit cell C5 adjacent to the unit cell C6. The operation suppression region 2y is a semiconductor region common to the gate protection-region of the unit cell C5 and also functions as a gate protection-region of the unit cell C5. According to the structure illustrated in FIG. 7, even in a case where the patterns of the trenches 10a and 10f of the unit cells C1 and C6 located at both ends of the array structure of the unit cells C1 to C3, . . . , C4 to C6 are collapsed, since the operations of the unit cells C1 and C6 are suppressed, the reliability can be improved.

Figure 8:
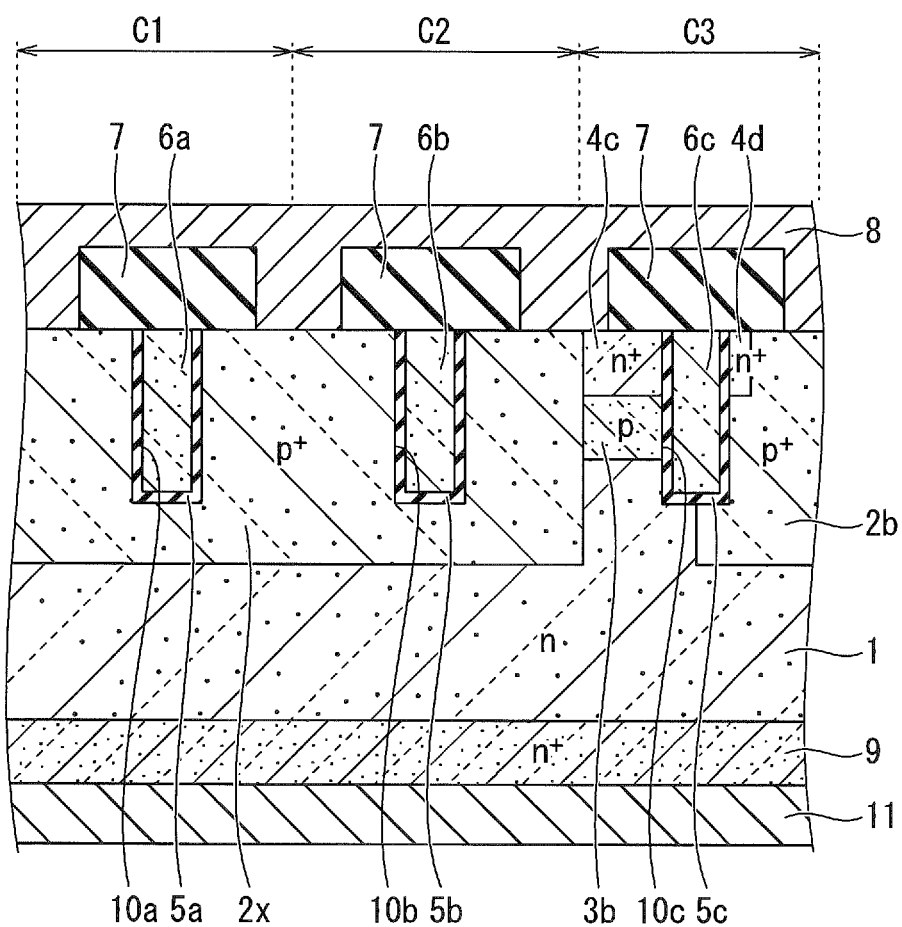
FIG. 8 is a cross-sectional view of main components illustrating another example of the insulated-gate semiconductor device according to the first embodiment.

In addition, as illustrated in FIG. 8, in the two unit cells C1 and C2 located at the ends of the array structure of the unit cells C1 to C3, . . . , C4 to C6, the bottom and both sidewall surfaces of the trenches 10a and 10b may be covered with the p+-type operation suppression region 2x. As a result, even in a case where the patterns of the trenches 10a and 10b of the two unit cells C1 and C2 located at the end of the array structure of the unit cells C1 to C3, . . . , C4 to C6 are collapsed, the operations of the unit cells C1 and C2 are suppressed, so that reliability can be improved.

Figure 9:
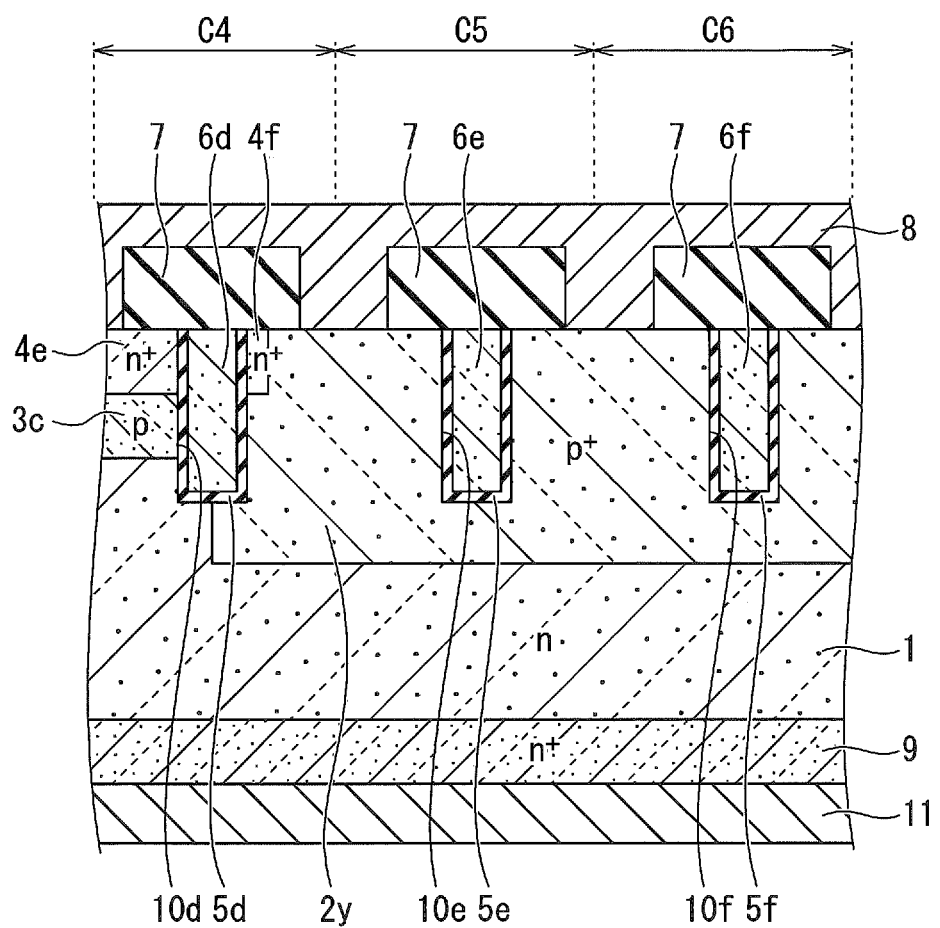
FIG. 9 is a cross-sectional view of main components illustrating another example of the insulated-gate semiconductor device according to the first embodiment.

In addition, as illustrated in FIG. 9, also in the two unit cells C5 and C6 located at the other ends of the array structure of the unit cells C1 to C3, . . . , C4 to C6, the bottom and both sidewall surfaces of the trenches 10e and 10f may be covered with the p$^+$-type operation suppression region 2y. The operation suppression region 2y is in contact with the bottom and the sidewall surface of the trench 10d of the unit cell C4 adjacent to the unit cell C5. The operation suppression region 2y is a semiconductor region common to the gate protection-region of the unit cell C4 and also functions as a gate protection-region of the unit cell C4. According to the structure illustrated in FIGS. 8 and 9, in the unit cells C1 and C2 and the unit cells C5 and C6 located at both ends of the array structure of the unit cells C1 to C3, . . . , C4 to C6, even in a case where the patterns of the trenches 10a and 10b and the trench 10e and 10f are collapsed, the operations of the unit cells C1 and C2 and the unit cells C5 and C6 are suppressed, so that the reliability can be improved.

In addition, the structure in which the trench 10a of one unit cell C0 at one end of the array structure of the unit cells C1 to C3, . . . , C4 to C6 illustrated in FIG. 1 is covered with the p$^+$-type operation suppression region 2x and the structure in which the trenches 10e and 10f of the two unit cells C5 and C6 at the other ends of the array structure of the unit cells C1 to C 3, . . . , C4 to C6 illustrated in FIG. 9 are covered with the p$^+$-type operation suppression region 2y may be combined. In addition, the structure in which the trenches 10a and 10b of the two unit cells C0 at one end of the array structure of the unit cells C1 to C3, . . . , C4 to C6 illustrated in FIG. 8 are covered with the p$^+$-type operation suppression region 2x, and the structure in which the trench 10f of one unit cell C6 at the other end of the array structure of the unit cells C1 to C3, . . . , C4 to C6 illustrated in FIG. 7 is covered with the p$^+$-type operation suppression region 2y may be combined.

Second Embodiment

Figure 10:
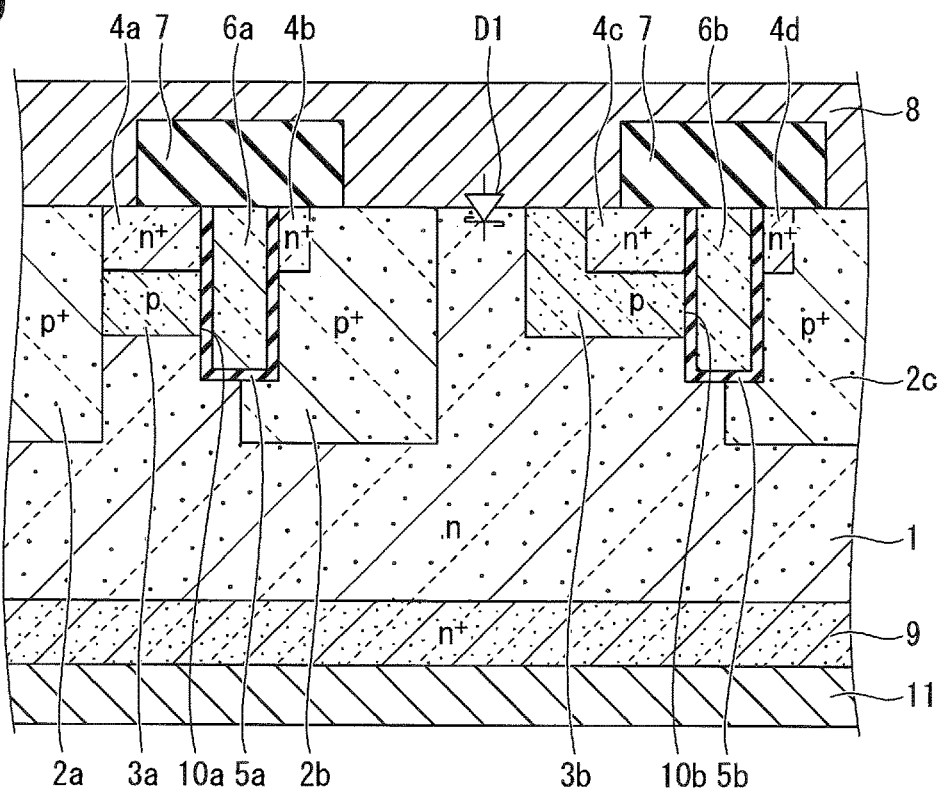
FIG. 10 is a cross-sectional view of main components illustrating an example of an insulated-gate semiconductor device according to a second embodiment.

As illustrated in FIG. 10, the insulated-gate semiconductor device according to the second embodiment includes a first conductivity type (n-type) drift layer 1 and second conductivity type (p$^+$-type) base regions 3a and 3b selectively provided on the drift layer 1. First conductivity type main-electrode regions (source regions) 4a to 4d having an impurity concentration higher than that of the drift layer 1 are provided in upper portions of the base regions 3a and 3b. In addition, since the main-electrode regions 4b and 4d are not used as current paths, the main-electrode regions may not be provided.

Trenches 10a and 10b are provided so as to penetrate the source regions 4a to 4d. One sidewall surface of the trench 10a is in contact with the source region 4a and the base region 3a, and the other sidewall surface is in contact with the source region 4b. One sidewall surface of the trench 10b is in contact with the source region 4c and the base region 3b, and the other sidewall surface is in contact with the source region 4d.

In the insulated-gate semiconductor device according to the second embodiment, the a-plane having relatively high electron mobility is used as the sidewall surfaces of the trenches 10a and 10b closer to the source regions 4a and 4c and the base regions 3a and 3b. On the other hand, the a-plane having relatively low electron mobility is used as the sidewall surfaces of the trenches 10a and 10b closer to the source regions 4b and 4d. That is, the sidewall surfaces of the trenches 10a and 10b closer to the source regions 4a and 4c and the base regions 3a and 3b become the first sidewall surfaces, and the sidewall surfaces of the trenches 10a and 10b closer to the source regions 4b and 4d become the second sidewall surfaces.

Insulated gate type electrode structures (5a, 6a) and (5b, 6b) implemented by gate insulating films 5a and 5b and gate electrodes 6a and 6b, respectively, are provided inside the trenches 10a and 10b. Second conductivity type (p$^+$-type) gate protection-regions 2a to 2c having an impurity concentration higher than that of the base regions 3a and 3b are selectively provided on the drift layer 1. The gate protection-region 2a is in contact with the source region 4a and the base region 3a. The gate protection-region 2b is in contact with the bottom surface and the sidewall surface of the trench 10a and in contact with the source region 4b. The gate protection-region 2c is in contact with the bottom surface and the sidewall surface of the trench 10b and is in contact with the source region 4d.

A first main electrode (source electrode) 8 is arranged on the gate electrodes 6a and 6b with an interlayer insulating film 7 interposed. The source electrode 8 is in contact with the source regions 4a and 4c and the gate protection-regions 2a to 2c. An n$^+$-type second main-electrode region (drain region) 9 is arranged on the bottom surface of the drift layer 1 so as to be in contact with the drift layer 1. A second main electrode (drain electrode) 11 is arranged on the bottom surface of the drain region 9.

In the insulated-gate semiconductor device according to the second embodiment, a Schottky barrier diode D1 implemented by the drift layer 1 and the source electrode 8 (schematically indicated by circuit symbols in FIG. 10) is provided between unit cells including the trenches 10a and 10b. The Schottky barrier diode D1 functions as a freewheeling diode (FWD). In the structure illustrated in FIG. 10, the Schottky junction of the Schottky barrier diode D1 is formed by the upper surface of the drift layer 1 located at the same horizontal level as the upper surfaces of the source regions 4a to 4d and the source electrode 8. Other structures and basic operations of the insulated-gate semiconductor device according to the second embodiment are the same as those of the insulated-gate semiconductor device according to the first embodiment, and thus, redundant description will be omitted.

According to the insulated-gate semiconductor device pertaining to the second embodiment, by incorporating the Schottky barrier diode D1, externally attached FWD becomes unnecessary, so that the number of parts can be reduced.

Figure 11:
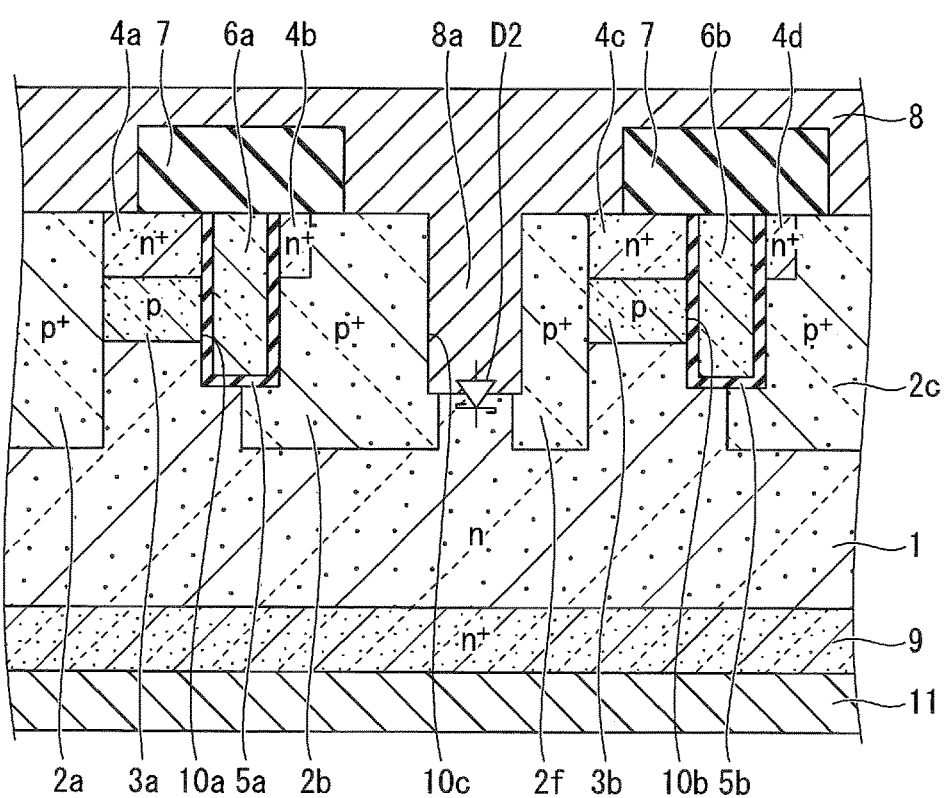
FIG. 11 is a cross-sectional view of main components illustrating another example of the insulated-gate semiconductor device according to the second embodiment.

In Modified Example of the insulated-gate semiconductor device according to the second embodiment illustrated in FIG. 11, the structure of a Schottky barrier diode D2 is different from that of the insulated-gate semiconductor device according to the second embodiment illustrated in FIG. 10. p$^+$-type gate protection-regions 2a to 2c and a p$^+$-type base-contact region 2f are selectively provided on the drift layer 1. The source electrode 8 has a protrusion 8a buried down to the same depth as the bottom surfaces of the trenches 10a and 10b so as to be interposed between the gate protection-region 2b and the base-contact region 2f. A Schottky junction is formed by the bottom surface of the protrusion 8a of the source electrode 8 and the drift layer 1, so that the Schottky barrier diode D2 is implemented.

Figure 12:
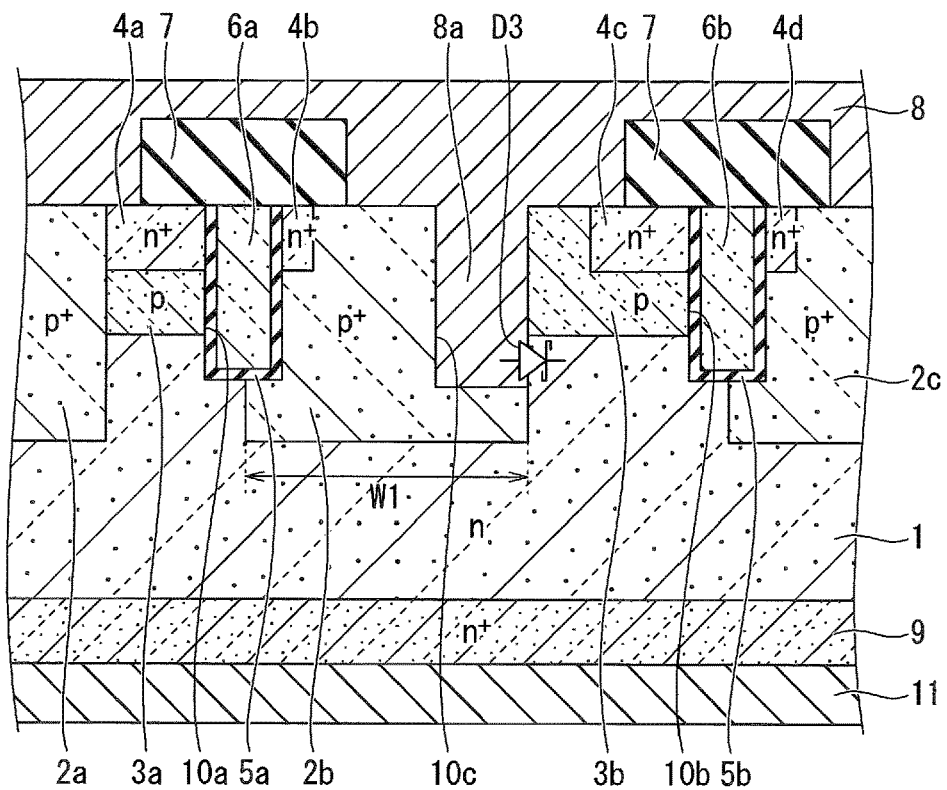
FIG. 12 is a cross-sectional view of main components illustrating another example of the insulated-gate semiconductor device according to the second embodiment.

In addition, in Modified Example of the insulated-gate semiconductor device according to the second embodiment illustrated in FIG. 12, the structure of a Schottky barrier diode D3 is different from that of the insulated-gate semiconductor device according to the second embodiment illustrated in FIG. 10. p$^+$-type gate protection-regions 2a to 2c are selectively provided on the drift layer 1. The source electrode 8 has a protrusion 8a buried down to the same depth as the bottom surfaces of the trenches 10a and 10b so as to be interposed between the gate protection-region 2b and the base region 3b. A Schottky junction is formed by the side surface of the protrusion 8a of the source electrode 8 and the drift layer 1, so that the Schottky barrier diode D3 is implemented. According to Modified Example of the insulated-gate semiconductor device pertaining to the second embodiment illustrated in FIG. 12, a Schottky junction is formed by the side surface of the protrusion 8a of the source electrode 8 and the drift layer 1. Therefore, while maintaining the area of the Schottky barrier diode D3, the width W1 of the gate protection-region 2b can be reduced, so that the chip size can be reduced.

Figure 13:
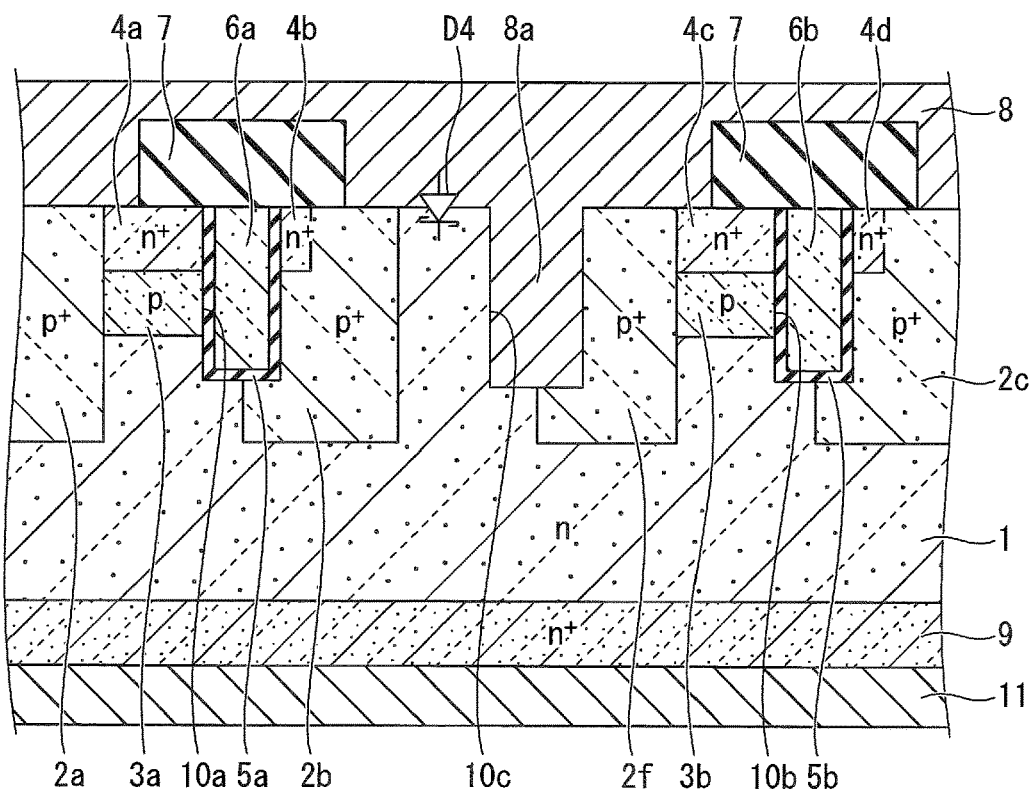
FIG. 13 is a cross-sectional view of main components illustrating another example of the insulated-gate semiconductor device according to the second embodiment.

In Modified Example of the insulated-gate semiconductor device according to the second embodiment illustrated in FIG. 13, the structure of the Schottky barrier diode D3 is different from that of the insulated-gate semiconductor device according to the second embodiment illustrated in FIG. 10. p$^+$-type gate protection-regions 2a to 2c and a p$^+$-type base-contact region 2f are selectively provided on the drift layer 1. The source electrode 8 has a protrusion 8a buried in the drift layer 1 down to the same depth as the bottom surfaces of the trenches 10a and 10b so as to be interposed between the drift layer 1 and the base-contact region 2f. The bottom surface of the protrusion 8a is in contact with the drift layer 1 and the base-contact region 2f. A Schottky junction is formed by the region extending from the bottom surface of the source electrode 8 to the side surface and the bottom surface of the protrusion 8a of the source electrode 8 and the drift layer 1 in a stepwise manner. According to Modified Example of the insulated-gate semiconductor device pertaining to the second embodiment illustrated in FIG. 13, the area of the Schottky barrier diode D4 can be increased, and the forward voltage can be reduced.

Third Embodiment

Figure 14:
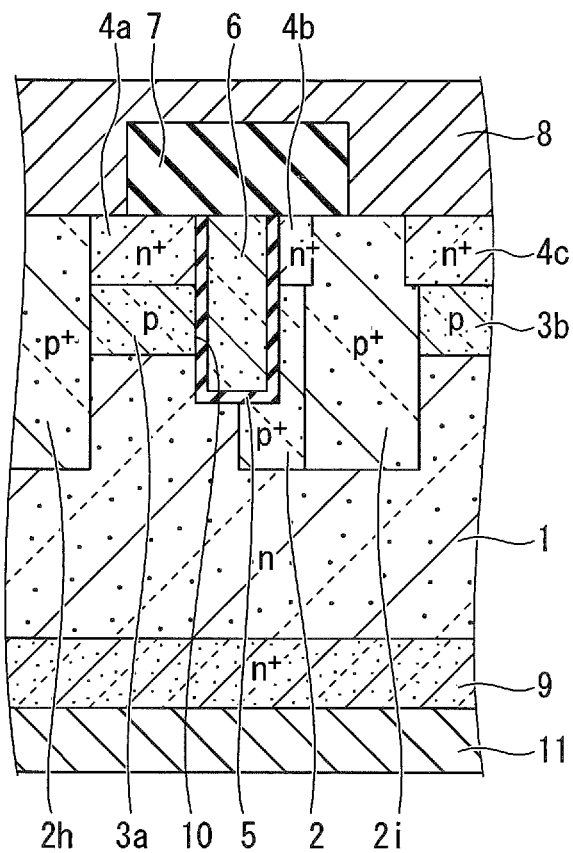
FIG. 14 is a cross-sectional view of main components illustrating an example of an insulated-gate semiconductor device according to a third embodiment.

As illustrated in FIG. 14, the insulated-gate semiconductor device according to the third embodiment include a first conductivity type (n-type) drift layer 1 and a second conductivity type (p-type) base regions 3a and 3b selectively provided on the drift layer 1. First conductivity type (n$^+$-type) main-electrode regions (source regions) 4a to 4c having an impurity concentration higher than that of the drift layer 1 are provided in upper portions of the base regions 3a and 3b. Since the source region 4b is not used as a current path, the source region 4b may not be provided. A trench 10 penetrating the source regions 4a and 4b and reaching the drift layer 1 is provided from the upper surfaces of the source regions 4a to 4c. One sidewall surface of the trench 10 is in contact with the source region 4a and the base region 3a, and the other sidewall surface is in contact with the source region 4b.

In the insulated-gate semiconductor device according to the third embodiment, the a-plane having a relatively high electron mobility is used as the sidewall surface of the trench 10 closer to the source region 4a and the base region 3a. That is, the sidewall surface of the trench 10 closer to the source region 4a side and the base region 3a become the first sidewall surface, and the sidewall surface of the trench 10 closer to the source region 4b becomes the second sidewall surface.

An insulated-gate electrode structure (5, 6) is provided inside the trench 10. A first main electrode (source electrode) 8 is arranged on the gate electrode 6 with an interlayer insulating film 7 interposed. The source electrode 8 is in contact with the source regions 4a and 4c. An n$^+$-type second main-electrode region (drain region) 9 is arranged on the bottom surface of the drift layer 1 so as to be in contact with the drift layer 1. A second main electrode (drain electrode) 11 is arranged on the bottom surface of the drain region 9.

A second conductivity type (p$^+$-type) gate protection-region 2 having an impurity concentration higher than that of the base regions 3a and 3b is selectively provided on the drift layer 1. The gate protection-region 2 is a region formed in a self-aligned manner by obliquely implanting p-type impurity ions into the sidewall surface and the bottom surface of the trench 10 at the time of manufacturing the insulated-gate semiconductor device according to the third embodiment. The gate protection-region 2 has an L-shaped cross-sectional pattern to be in contact with the bottom surface and the sidewall surface of the trench 10.

Second conductivity type (p$^+$-type) base-contact regions 2h and 2i having an impurity concentration higher than that of the base regions 3a and 3b are selectively provided on the drift layer 1. The base-contact region 2h is in contact with the source region 4a and the base region 3a. The base-contact region 2i is in contact with the source regions 4b and 4c, the base region 3b, and the gate protection-region 2. For example, the impurity concentration of the gate protection-region 2 may be higher than the impurity concentration of the base-contact regions 2h and 2i or may be the same as the impurity concentration of the base-contact regions 2h and 2i. Other structures and basic operations of the insulated-gate semiconductor device according to the third embodiment are similar to those of the insulated-gate semiconductor device according to the first embodiment, and thus, redundant description will be omitted.

According to the insulated-gate semiconductor device pertaining to the third embodiment, by providing the gate protection-region 2 so as to be in contact with the bottom surface and the sidewall surface of the trench 10, electric field concentration on the bottom of the trench 10 can be suppressed, so that the gate insulating film 5 of the bottom of the trench 10 can be protected.

Next, the method of manufacturing the insulated-gate semiconductor device according to the third embodiment will be described with reference to FIGS. 15 to 23 by exemplifying the case of a trench gate MISFET. In addition, the method of manufacturing the trench gate MISFET described below is merely an example and can be realized by various other manufacturing methods including this modified example within the spirit described in the claims.

Figure 15:
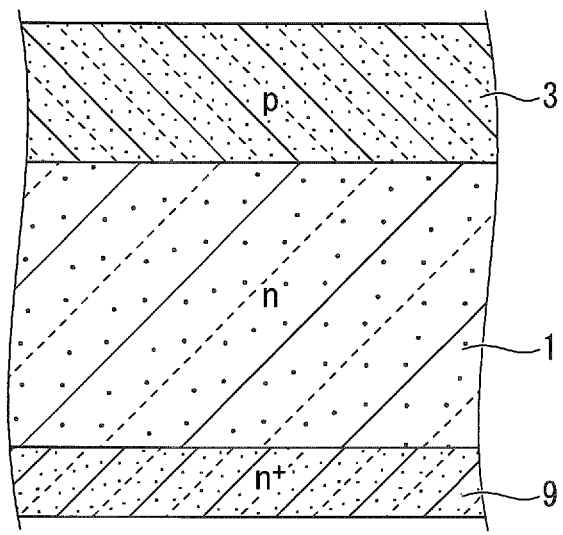
FIG. 15 is a process cross-sectional view for describing an example of a method of manufacturing the insulated-gate semiconductor device according to the third embodiment.

First, an n$^+$-type semiconductor substrate (SiC substrate) doped with n-type impurities such as nitrogen (N) or the like is prepared. For example, the SiC substrate is a 4H—SiC substrate and has an off angle of 4°. By using the n$^+$-type SiC substrate as the drain region 9, as illustrated in FIG. 15, the n-type drift layer 1 and the p-type base region 3 are sequentially epitaxially grown on the upper surface of the drain region 9.

Figure 16:
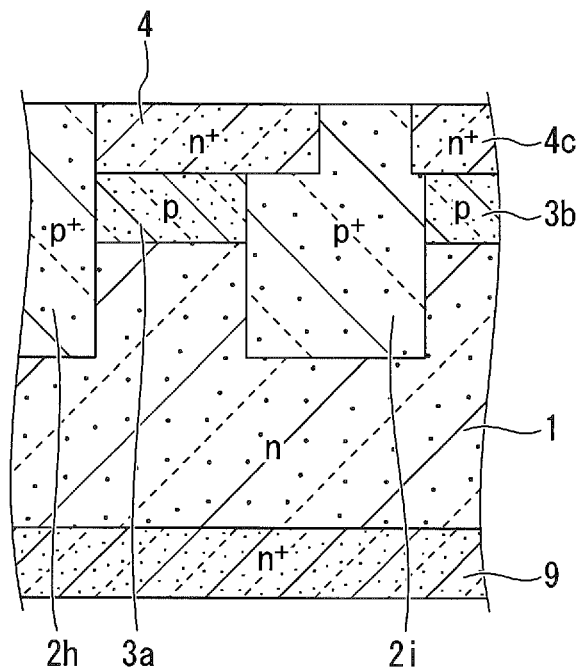
FIG. 16 is a process cross-sectional view continued from FIG. 15 for describing the example of the method of manufacturing the insulated-gate semiconductor device according to the third embodiment.

Next, a photoresist film is coated on the upper surface of the base region 3, and the photoresist film is delineated by a photolithography technique. By using the delineated photoresist film as a mask for ion implantation, n-type impurity ions such as N are implanted with multiple acceleration energies. After removal of the mask for ion implantation, a photoresist film is newly coated on the base region 3, and the photoresist film is delineated by a photolithography technique. By using the delineated photoresist film as a mask for ion implantation, p-type impurity ions such as Al are implanted with multiple acceleration energies. After removal of the mask for ion implantation, annealing is performed to activate the implanted n-type impurity ions and p-type impurity ions. As a result, as illustrated in FIG. 16, $p^+$-type base-contact regions 2h and 2i are selectively formed in an upper portion of the drift layer 1 so as to be exposed to the upper surfaces of the base regions 3a and 3b. In addition, $n^+$-type source regions 4 and 4c are selectively formed in an upper portion of the base regions 3a and 3b.

Figure 17:
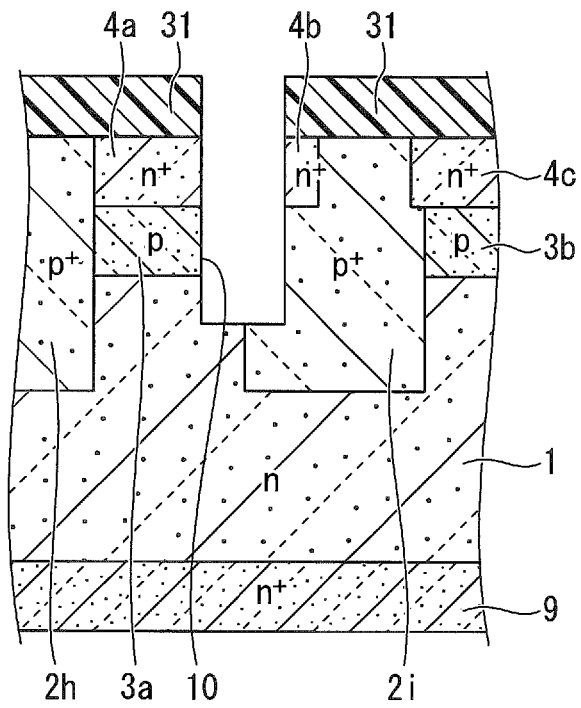
FIG. 17 is a process cross-sectional view continued from FIG. 16 for describing the example of the method of manufacturing an insulated-gate semiconductor device according to a third embodiment.

Next, a photoresist film 31 is coated on the upper surfaces of the source regions 4 and 4c and the base-contact regions 2h and 2i, and the photoresist film 31 is delineated by a photolithography technique. By using the delineated photoresist film 31 as a mask for etching, portions of the source region 4, the base region 3a, the base-contact region 2i, and the drift layer 1 are selectively removed by dry etching such as reactive ion etching (RIE). As a result, as illustrated in FIG. 17, the trench 10 is selectively formed so as to reach the upper portion of the drift layer 1. One sidewall surface of the trench 10 is the first sidewall surface and exposes the source region 4a and the base region 3a. The other sidewall surface of the trench 10 is the second sidewall surface and exposes the base-contact region 2i. The bottom surface of the trench 10 exposes the drift layer 1 and the base-contact region 2i.

Figure 18:
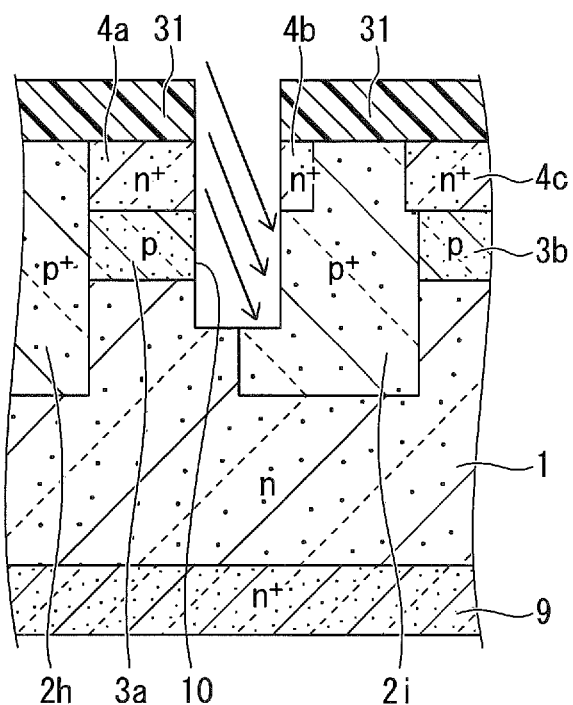
FIG. 18 is a process cross-sectional view continued from FIG. 17 for describing the example of the method of manufacturing the insulated-gate semiconductor device according to the third embodiment.
Figure 19:
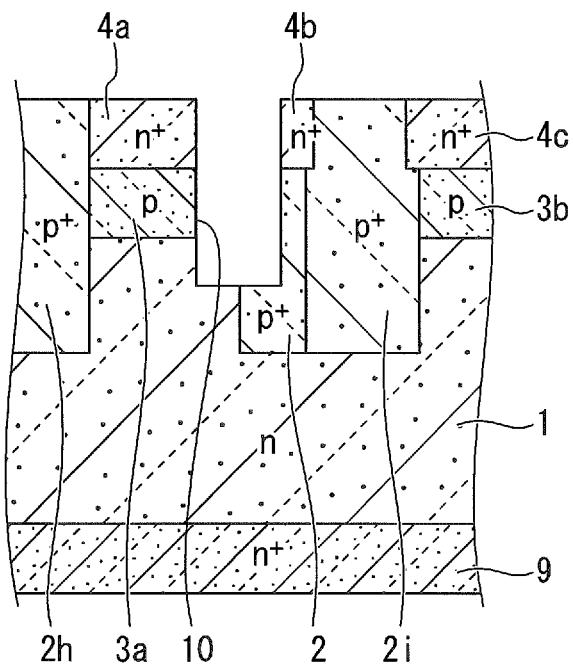
FIG. 19 is a process cross-sectional view continued from FIG. 18 for describing the example of the method of manufacturing the insulated-gate semiconductor device according to the third embodiment.

Next, as illustrated in FIG. 18, by using the photoresist film 31 as a mask for ion implantation, p-type impurity ions are obliquely implanted into the sidewall surface and the bottom surface of the trench 10 closer to the base-contact region 2i. After removal of the photoresist film 31 as a mask for ion implantation, annealing is performed to activate the implanted p-type impurity ions. As a result, as illustrated in FIG. 19, a gate protection-region 2 having an L-shaped cross-sectional pattern is formed in a self-aligning manner so as to be exposed to the sidewall surface and the bottom surface of the trench 10.

Figure 20:
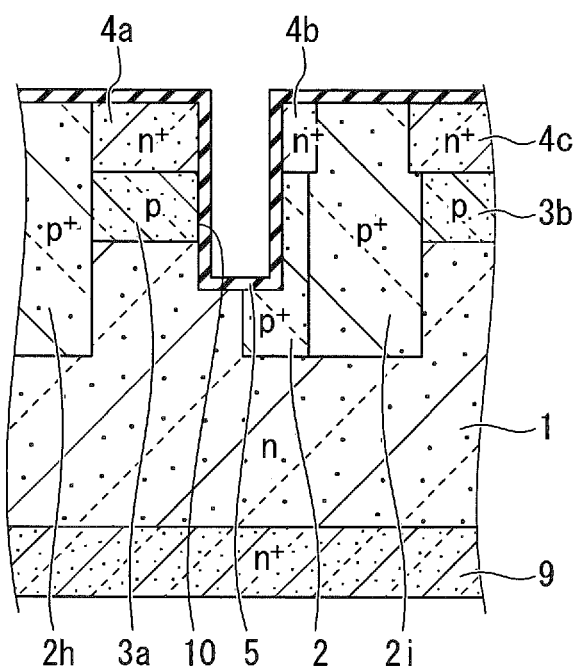
FIG. 20 is a process cross-sectional view continued from FIG. 19 for describing the example of the method of manufacturing the insulated-gate semiconductor device according to the third embodiment.
Figure 21:
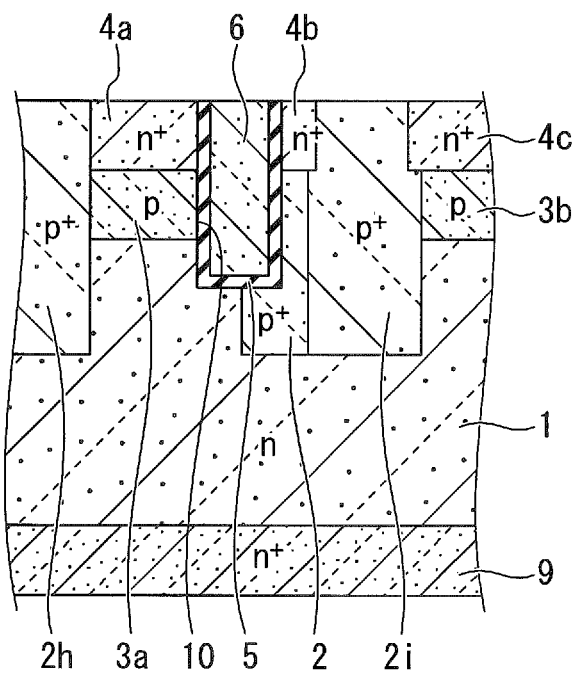
FIG. 21 is a process cross-sectional view continued from FIG. 20 for describing the example of the method of manufacturing the insulated-gate semiconductor device according to the third embodiment.

Next, as illustrated in FIG. 20, by a thermal oxidation method, a chemical vapor deposition (CVD), or the like, a gate insulating film 5 such as an $SiO_2$ film is formed on the bottom surface and the sidewall surface of the trench 10 and the upper surfaces of the source regions 4a to 4c and the base-contact regions 2h and 2i of the trench 10. Next, a polysilicon layer (doped polysilicon layer) doped with impurities such as phosphorus (P) at a high impurity concentration is deposited by a CVD method or the like so as to bury the trench 10. After that, the polysilicon layer and the gate insulating film 5 on the upper surfaces of the source regions 4a to 4c and the base-contact regions 2h and 2i are removed by etch back, chemical mechanical polishing (CMP), or the like. As a result, as illustrated in FIG. 21, a gate electrode 6 made of a polysilicon layer is buried in the trench 10, so that an insulated-gate electrode structure (5, 6) is formed.

Figure 22:
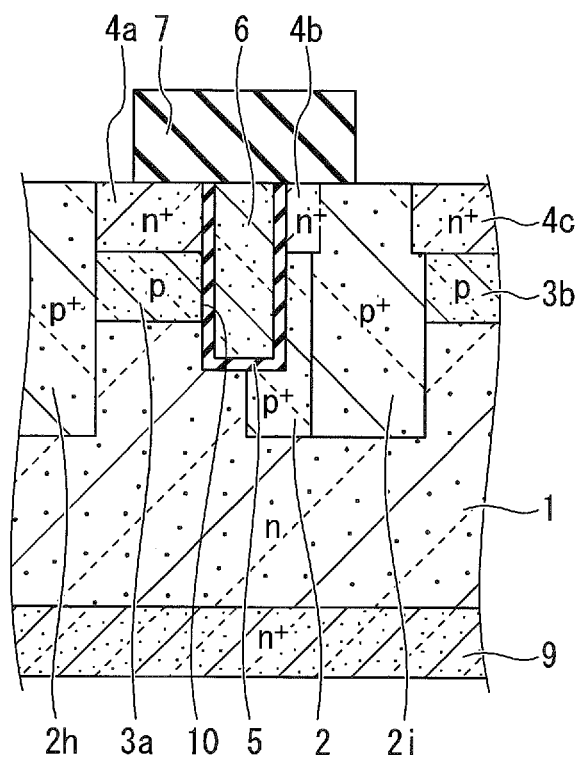
FIG. 22 is a process cross-sectional view continued from FIG. 21 for describing the example of the method of manufacturing the insulated-gate semiconductor device according to the third embodiment.

Next, an interlayer insulating film 7 is deposited on the upper surface of the insulated-gate electrode structure (5, 6) by the CVD method or the like. Then, as illustrated in FIG. 22, a portion of the interlayer insulating film 7 is selectively removed by a photolithography technique and dry etching. As a result, a source contact hole is cut in the interlayer insulating film 7. Although not illustrated, a gate contact hole is also cut in the interlayer insulating film 7 so that a portion of the gate surface electrode connected to the gate electrode 6 is exposed at a position different from the source contact hole.

Figure 23:
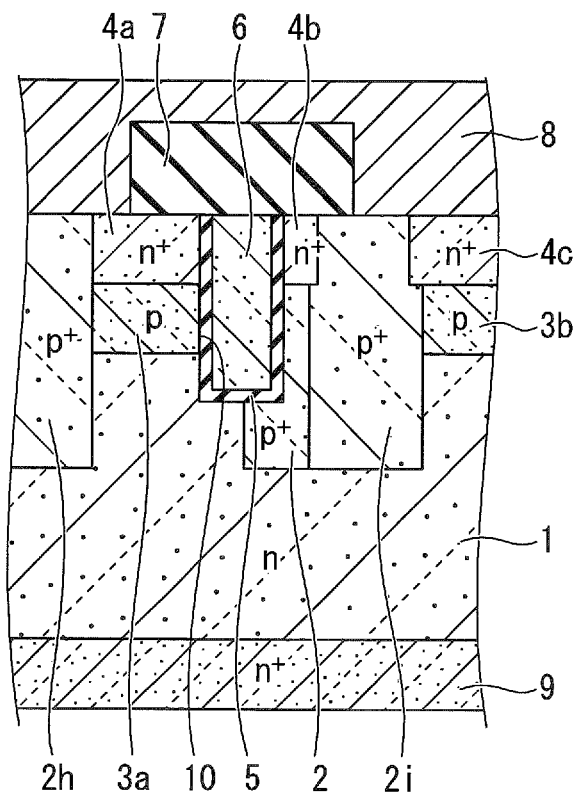
FIG. 23 is a process cross-sectional view continued from FIG. 22 for describing the example of the method of manufacturing the insulated-gate semiconductor device according to the third embodiment.

Next, a metallic layer such as an Al film is deposited by a sputtering method or the like. As illustrated in FIG. 23, a pattern of a source electrode 8 and a gate surface electrode (not illustrated) is formed by delineating the metallic layer such as an Al film by a photolithography technique and RIE or the like. As a result, the pattern of the source electrode 8 and the pattern of the gate surface electrode are separated. Next, as illustrated in FIG. 14, a drain electrode 11 made of Au or the like is formed on the entire bottom surface of the drain region 9 by a sputtering method, a vapor deposition method, or the like. In this manner, the insulated-gate semiconductor device according to the third embodiment of the present invention is completed.

According to the method of manufacturing the insulated-gate semiconductor device pertaining to the third embodiment, after forming the trench 10, by obliquely implanting the p-type impurity ions, the gate protection-region 2 in contact with the bottom surface and the sidewall surface of the trench 10 can be formed in a self-aligned manner. Therefore, the insulated-gate semiconductor device illustrated in FIG. 14 can be easily realized.

Figure 24:
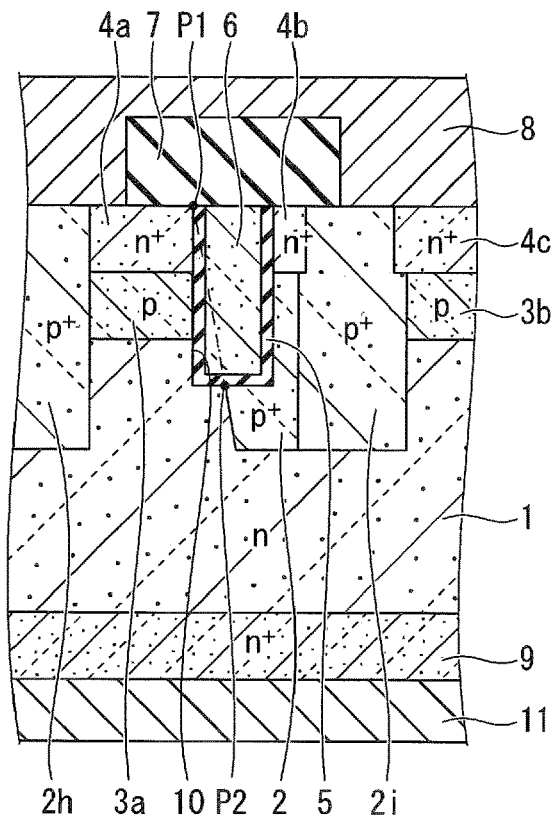
FIG. 24 is a cross-sectional view of main components illustrating another example of the insulated-gate semiconductor device according to the third embodiment.

In addition, Modified Example of the insulated-gate semiconductor device according to the third embodiment illustrated in FIG. 24 is different from the insulated-gate semiconductor device according to the third embodiment illustrated in FIG. 14 in that the side surface of the end of the gate protection-region 2 in contact with the bottom surface of the trench 10 is inclined with respect to the vertical direction. The end of the gate protection-region 2 in contact with the bottom surface of the trench 10 is inclined in parallel to a straight line connecting a position P1 of the upper end of the trench 10 and a position P2 of the end of the gate protection-region 2 in contact with the bottom surface of the trench 10.

In a manufacturing method of Modified Example of the insulated-gate semiconductor device according to the third embodiment illustrated in FIG. 24, for example, the trench 10 is formed so as to be separated from the base-contact region 2i and expose the drift layer 1 to the sidewall surface and the bottom surface. After that, ion implantation is performed obliquely on the sidewall surface and the bottom surface of the trench 10 so that the region where the end of the gate protection-region 2 is formed does not overlap with the base-contact region 2i. Therefore, the gate protection-region 2 of which the side surface of the end in contact with the bottom surface of the trench 10 is inclined can be formed in a self-aligned manner.

Figure 25:
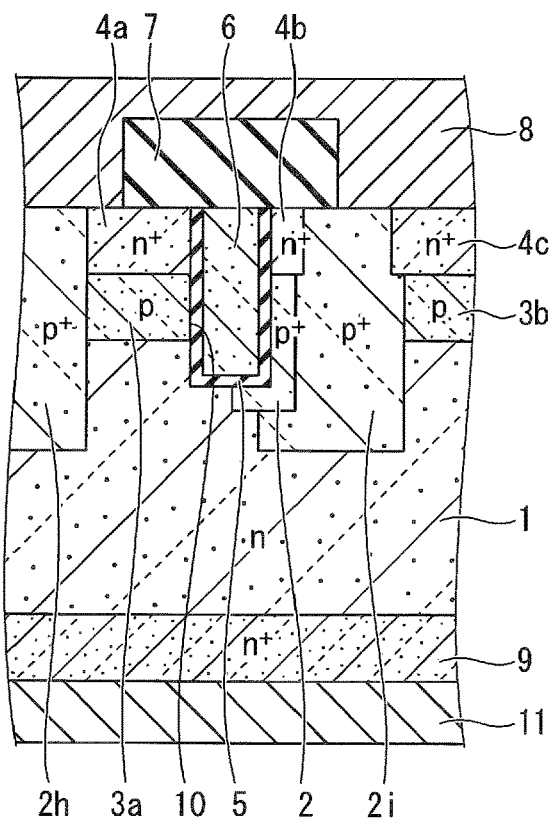
FIG. 25 is a cross-sectional view of main components illustrating another example of the insulated-gate semiconductor device according to the third embodiment.

In addition, Modified Example of the insulated-gate semiconductor device according to the third embodiment illustrated in FIG. 25 is different from the insulated-gate semiconductor device illustrated in FIG. 14 in that the bottom surface of the gate protection-region 2 is shallower than the bottom surface of the base-contact region 2i. In a manufacturing method of Modified Example of the insulated-gate semiconductor device according to the third embodiment illustrated in FIG. 25, for example, the trench 10 is formed so as to be separated from the base-contact region 2i and expose the drift layer 1 to the sidewall surface and the bottom surface. After that, by performing ion implantation obliquely on the sidewall surface and the bottom surface of the trench 10, the gate protection-region 2 can be formed in a self-aligned manner at a position shallower than the bottom surface of the base-contact region 2i.

Figure 26:
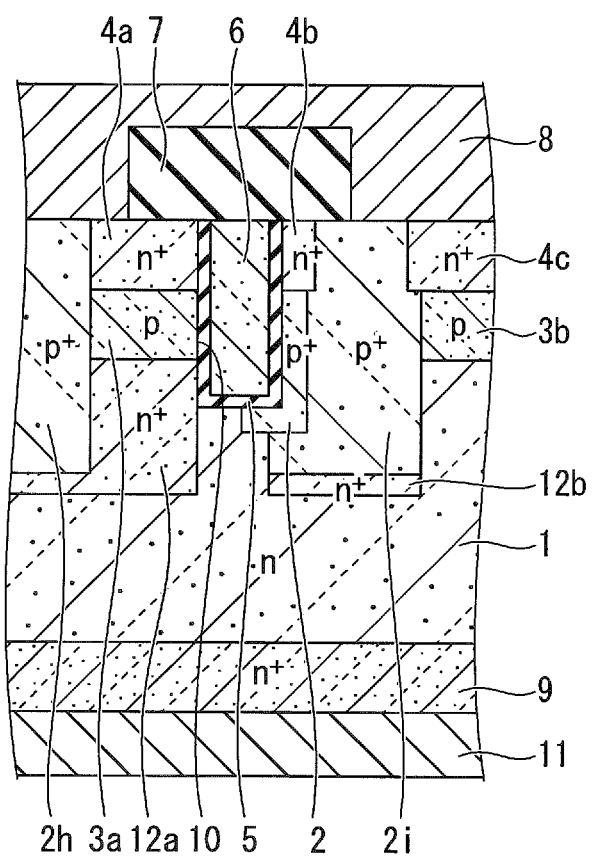
FIG. 26 is a cross-sectional view of main components illustrating another example of the insulated-gate semiconductor device according to the third embodiment.

FIG. 26 illustrates Modified Example of the insulated-gate semiconductor device according to the third embodiment. The insulated-gate semiconductor device illustrated in FIG. 26 is different from the insulated-gate semiconductor device illustrated in FIG. 14 in that $n^+$-type current spreading layers (CSL) 12a and 12b are provided on the bottom surfaces of the base-contact regions 2h and 2i and the base region 3a. By providing the current spreading layers 12a and 12b, the on-resistance can be reduced. The current spreading layers 12a and 12b can be formed by implanting n-type impurity ions such as nitrogen (N) into the drift layer 1. In addition, current spreading layers may be provided only on the bottom surfaces of the base-contact regions 2h and 2i.

Fourth Embodiment

Figure 27:
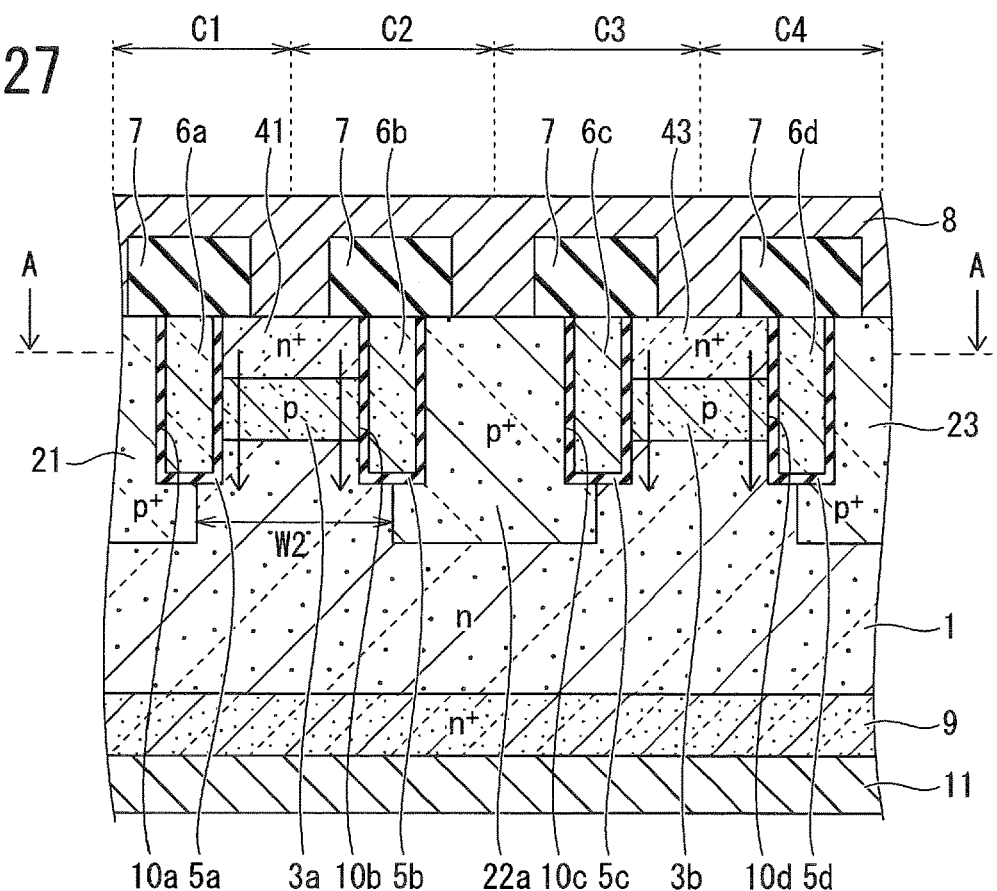
FIG. 27 is a cross-sectional view of main components illustrating an example of an insulated-gate semiconductor device according to a fourth embodiment.

As illustrated in FIG. 27, an insulated-gate semiconductor device according to a fourth embodiment has an array structure of a plurality of stripe-shaped unit cells C1 to C4 which have four striped trenches 10a to 10d, respectively. The insulated-gate semiconductor device according to the fourth embodiment includes a first conductivity type (n-type) drift layer 1 and second conductivity type (p-type) base regions 3a and 3b arranged on the drift layer 1. First conductivity type ($n^+$-type) main-electrode regions (source regions) 41 and 43 having an impurity concentration higher than that of the drift layer 1 are provided in upper portions of the base regions 3a and 3b.

Trenches 10a to 10d are provided so as to extend from the upper surfaces of the source regions 41 and 43 and reach the drift layer 1. The trenches 10a and 10b are in contact with both ends of the source region 41 and the base region 3a, respectively, with the source region 41 and the base region 3a interposed. The trenches 10c and 10d are in contact with both ends of the source region 43 and the base region 3b, respectively, with the source region 43 and the base region 3b interposed.

Insulated gate type electrode structures (5a, 6a), (5b, 6b), (5c, 6c), and (5d, 6d) implemented by gate insulating films 5a to 5d and gate electrodes 6a to 6d are provided on inner sides of the trenches 10a to 10d. A first main electrode (source electrode) 8 is arranged on the gate electrodes 6a to 6d with interlayer insulating films 7 interposed. An $n^+$-type second main-electrode region (drain region) 9 is arranged on the bottom surface of the drift layer 1 so as to be in contact with the drift layer 1. A second main electrode (drain electrode) 11 is arranged on the bottom surface of the drain region 9.

Second conductivity type ($p^+$-type) gate protection-regions 21, 22a, and 23 having an impurity concentration higher than that of the base regions 3a and 3b are selectively provided on the drift layer 1. The gate protection-region 21 is in contact with the bottom surface and the sidewall surface of the trench 10a. The gate protection-region 22a is in contact with the bottom surface and the sidewall surface of the trench 10b and is in contact with the bottom surface and the sidewall surface of the trench 10c. The gate protection-region 23 is in contact with the bottom surface and the sidewall surface of the trench 10d.

In the insulated-gate semiconductor device according to the fourth embodiment, the a-plane is used as both sidewall surfaces of the trenches 10a to 10d. For example, the a-plane having a relatively high electron mobility is used as the sidewall surface of the trench 10a closer to the gate protection-region 21, the sidewall surface of the trench 10b closer to the source region 41 and the base region 3a, the sidewall surface of the trench 10c closer to the gate protection-region 22a, and the sidewall surface of the trench 10d closer to the source region 42 and the base region 3b and is defined as a first sidewall surface. On the other hand, a-plane having a relatively low electron mobility is used as the sidewall surface of the trench 10a closer to the source region 41 and the base region 3a, the sidewall surface of the trench 10b closer to the gate protection-region 22a, the sidewall surface of the trench 10c closer to the source region 42 side and the base region 3b, and the sidewall surface of the trench 10d closer to the gate protection-region 23 and is defined as a second sidewall surface. Alternatively, the first sidewall surface and the second sidewall surface may be reversed as described above as both sidewall surfaces of the trenches 10a to 10d.

In addition, in the insulated-gate semiconductor device according to the fourth embodiment, an m-plane which is (1-100) plane may be used as both sidewall surfaces of the trenches 10a to 10d. In addition, in a case where the m-plane is used, since the inclination angles of the both sidewall surfaces of the trenches 10a to 10d with respect to the reference plane (m-plane) are the same, so that the electron mobilities on both sidewall surfaces of the trenches 10a to 10d are the same.

In the insulated-gate semiconductor device according to the fourth embodiment, a structure in which common base region 3a and source regions 41 and 43 are interposed between the trenches 10a and 10b of the adjacent unit cells C1 and C2 and between the trenches 10c and 10d of the adjacent unit cells C3 and C4 and a structure in which a common gate protection-region 22a is interposed between the trenches 10b and 10c of the adjacent unit cells C2 and C3 are alternately repeated. Other structures of the insulated-gate semiconductor device according to the fourth embodiment are similar to those of the insulated-gate semiconductor device according to the first embodiment, and thus, redundant description will be omitted.

At the time of operation of the insulated-gate semiconductor device according to the fourth embodiment, a positive voltage is applied to the drain electrode 11, and a positive voltage equal to or higher than a threshold value is applied to the gate electrodes 6a to 6d. Therefore, inversion layers (channels) are formed on both side surface of the base regions 3a and 3b, and thus, the transistor is turned on. In the turned-on state, a current flows from the drain electrode 11 to the source electrode 8 through the drain region 9, the drift layer 1, the inversion layers on both side surfaces of the base regions 3a and 3b, and the source regions 41 and 43. On the other hand, in a case where the voltage applied to the gate electrodes 6a to 6d is lower than the threshold value, since no inversion layer is formed on both side surfaces of the base regions 3a and 3b, the transistor is turned off, and thus, no current flows from the drain electrode 11 to the source electrode 8.

Figure 28:
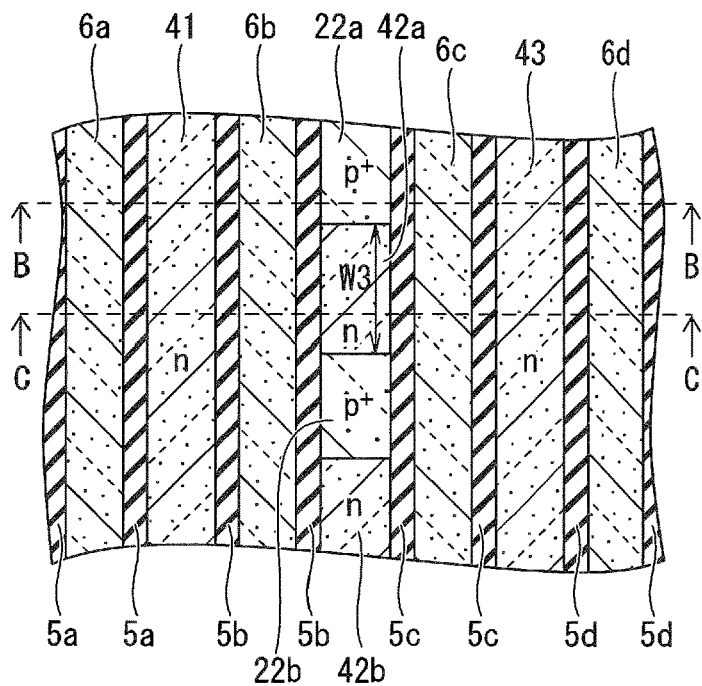
FIG. 28 is a horizontal cross-sectional view of the insulated-gate semiconductor device according to the fourth embodiment taken from the A-A direction in FIG. 27.
Figure 29:
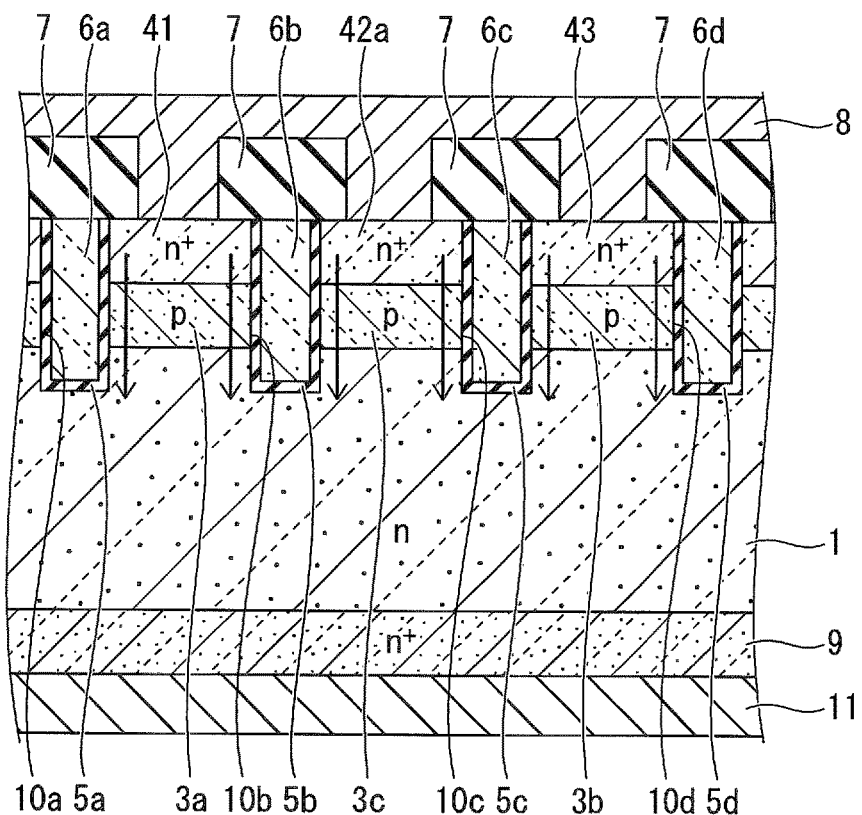
FIG. 29 is a vertical cross-sectional view of the insulated-gate semiconductor device according to the fourth embodiment taken from the C-C direction in FIG. 28.

FIG. 28 illustrates a plan layout taken from the A-A direction in which the source regions 41 and 43 in FIG. 27 are horizontally cut. FIG. 27 is a cross-sectional view taken from the B-B direction in FIG. 28. As illustrated in FIG. 28, the planar patterns of the source regions 41 and 43 and the gate electrodes 6a to 6d are each formed in a stripe shape and extend parallel to each other. In addition, the gate protection-regions 22a and 22b are intermittently provided at predetermined intervals along the longitudinal direction of the source regions 41 and 43 and the gate electrodes 6a to 6d. Source regions 42a and 42b are provided between the gate protection-regions 22a and 22b. It is preferable that the interval W3 between the gate protection-regions 22a and 22b is equal to or less than (equal to or narrower than) the interval (JFT width) W2 of the junction field effect transistor (JFET) region interposed by the gate protection-regions 21 and 22a illustrated in FIG. 27. FIG. 29 is a cross-sectional view taken from the C-C direction in FIG. 28. As illustrated in FIG. 29, a base region 3c is provided on the bottom surface of the source region 42a.

Figure 30:
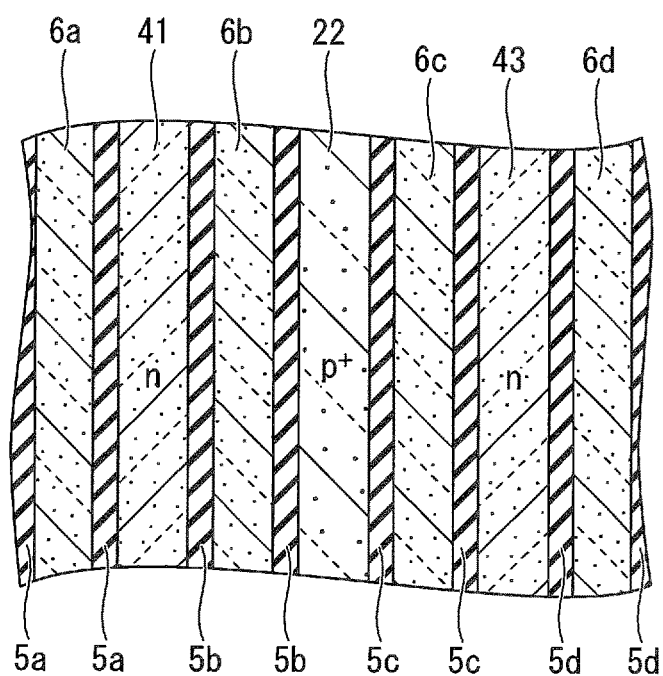
FIG. 30 is another horizontal cross-sectional view of the insulated-gate semiconductor device according to Comparative Example taken from the A-A direction in FIG. 27.

Herein, an insulated-gate semiconductor device according to Comparative Example will be described. In the insulated-gate semiconductor device according to Comparative Example, as illustrated in FIG. 30, the gate protection-region 22 constitutes a planar pattern extending along the longitudinal direction of the trenches 10a to 10d. On the other hand, according to the insulated-gate semiconductor device pertaining to the fourth embodiment, the gate protection-regions 22a and 22b are provided intermittently, and the space between the gate protection-regions 22a and 22b is used as the source regions 42a and 42b. Therefore, the channel can be increased, and the on-resistance can be reduced.

In addition, in the structure illustrated in FIG. 29, the base region 3c on the bottom surface of the source region 42a may not be provided, and the Schottky barrier diode may be implemented by the source region 42a and the source electrode 8 in the region of the planar pattern of the source region 42a. That is, the Schottky barrier diode may be provided in each region between the gate protection-regions 22a and 22b.

Figure 31:
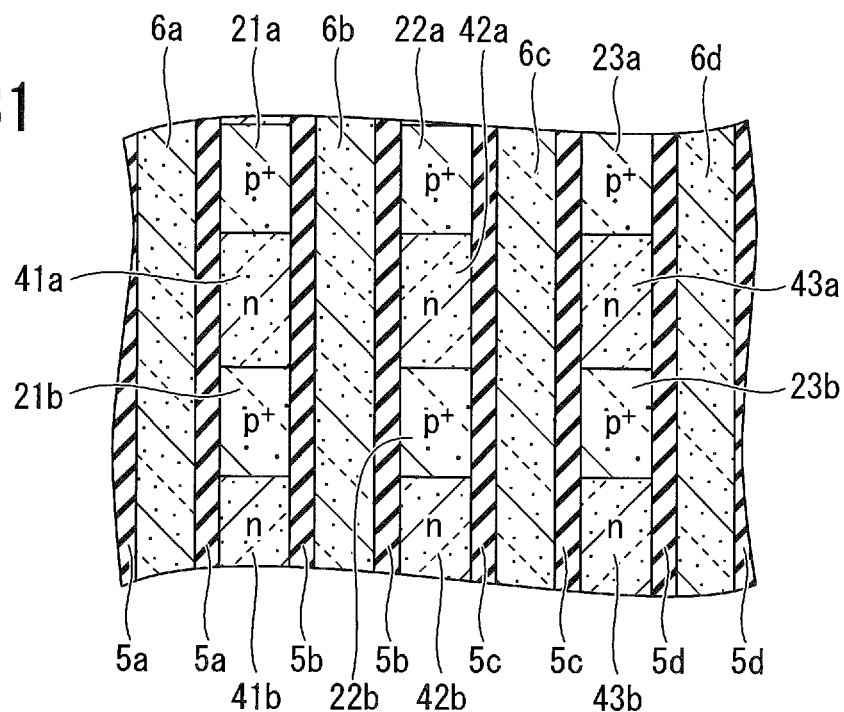
FIG. 31 is another horizontal cross cross-sectional view of the insulated-gate semiconductor device according to the fourth embodiment taken from the A-A direction in FIG. 27.

In addition, as illustrated in FIG. 31, the gate protection-regions 21a and 21b interposed between the trenches 10a and 10b (refer to FIG. 27) may be provided intermittently along the longitudinal direction of the trenches 10a and 10b. The gate protection-regions 21a and 21b and the source regions 41a and 41b are alternately provided. In addition, the gate protection-regions 23a and 23b interposed between the trenches 10c and 10d (refer to FIG. 27) may be provided intermittently along the longitudinal direction of the trenches 10c and 10d. The gate protection-regions 23a and 23b and the source regions 43a and 43b are alternately provided.

In addition, as illustrated in FIG. 31, the array of the gate protection-regions 21a and 21b, the array of the gate protection-regions 22a and 22b, and the array of the gate protection-regions 23a and 23b may be provided at the same positions in the direction (parallel direction of the trenches 10a to 10d) perpendicular to the longitudinal direction of the trenches 10a to 10d (refer to FIG. 27). In the parallel direction of the trenches 10a to 10d, the gate protection-regions 21a, 22a, and 23a and the gate protection-regions 21a, 22a, and 23a are arranged at the same positions. In addition, in the parallel direction of the trenches 10a to 10d, the source regions 41a, 42a, and 43a and the source regions 41b, 42b, and 43b are arranged at the same positions.

Figure 32:
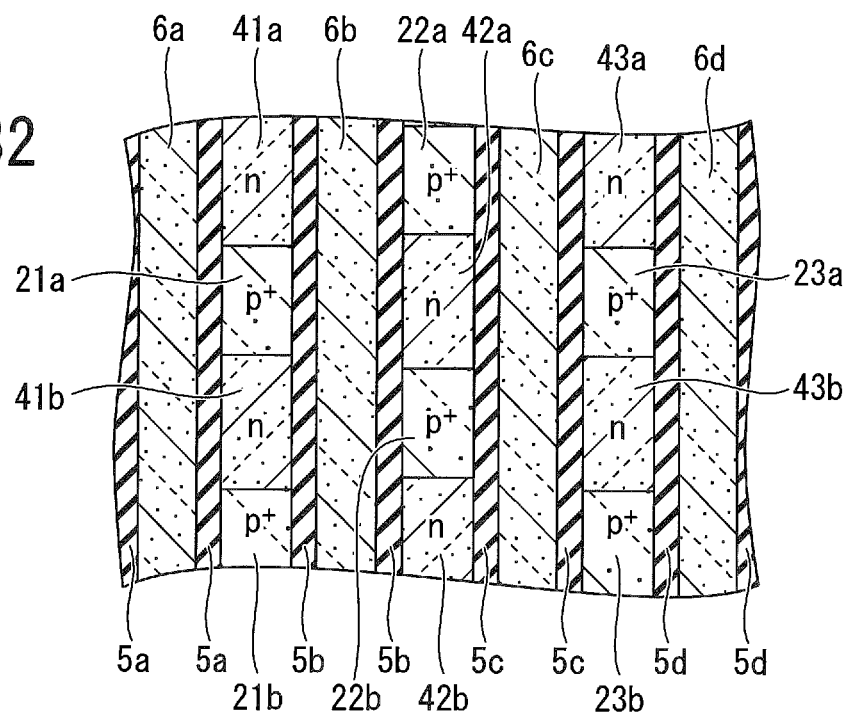
FIG. 32 is another horizontal cross cross-sectional view of the insulated-gate semiconductor device according to the fourth embodiment taken from the A-A direction in FIG. 27.

In addition, as illustrated in FIG. 32, the array of the gate protection-regions 21a and 21b, the array of the gate protection-regions 22a and 22b, and the array of the gate protection-regions 23a and 23b may be arranged so as to be shifted from each other in the parallel direction of the trenches 10a to 10d. In the parallel direction of the trenches 10a to 10d, the gate protection-regions 21a, 22a, and 23a and the gate protection-regions 21b, 22b, and 23b are arranged so as to be shifted from each other. In addition, in the parallel direction of the trenches 10a to 10d, the source regions 41a, 42a, and 43a and the source regions 41b, 42b, and 43b are arranged shifted from each other.

OTHER EMBODIMENTS

As described above, the invention has been described according to the first to fourth embodiments, but it should not be understood that the description and drawings constituting a portion of this disclosure limit the invention. From this disclosure, various alternative embodiments, examples, and operational techniques will be apparent to those skilled in the art.

In the first to fourth embodiments of the invention, the MISFET having the insulated-gate electrode structure in the trench is exemplified, but the invention is not limited to the MISFET. The invention can be applied to insulated-gate semiconductor devices having various insulated-gate electrode structures such as IGBTs having insulated-gate electrode structures in the trenches. As the trench gate IGBT, there may employed a structure in which the $n^+$-type source regions 4a to 4j of the MISFET illustrated in FIGS. 2 and 3 are used as emitter regions, and a $p^+$-type collector region is provided on the bottom surface side of the drift layer 1 instead of the $n^+$-type drain region 9.

In addition, in the embodiment of the invention, the insulated-gate semiconductor device using SiC is exemplified. However, the invention can be applied to an insulated-gate semiconductor device using a semiconductor (wide band gap semiconductor) having a forbidden band width larger than that of SiC and having a hexagonal system such as gallium nitride (GaN), aluminum nitride (GaN), or indium nitride (InN).

What is claimed is:

1. An insulated-gate semiconductor device comprising:
    an insulated-gate electrode structure arranged inside a trench defining both sidewalls in a first sidewall surface having a first inclination angle with respect to a reference plane of a chip structure and a second sidewall surface facing the first sidewall surface and having a second inclination angle different from the first inclination angle with respect to the reference plane;
    a first conductivity type main-electrode region being in contact with a first sidewall surface of the trench and having a high impurity concentration;
    a second conductivity type based region being in contact with a bottom surface of the main-electrode region and the first sidewall surface;
    a first conductivity type drift layer being in contact with a bottom surface of the base region and the first sidewall surface and having an impurity concentration lower than that of the main-electrode region;
    a second conductivity type gate protection-region being in contact with the second sidewall surface and a bottom surface of the trench and having an impurity concentration higher than that of the base region; and
    a second conductivity type base-contact region being in contact with the gate protection-region while being separated from the trench and having an impurity concentration higher than that of the base region.

2. The insulated-gate semiconductor device of claim 1, wherein the impurity concentration of the gate protection-region is higher than that of the base-contact region.

3. The insulated-gate semiconductor device of claim 1, wherein a side surface of an end of the gate protection-region being in contact with the bottom surface of the trench is inclined parallel to a straight line connecting an upper end of the first sidewall surface of the trench and the end of the gate protection-region being in contact with the bottom surface of the trench.

4. The insulated-gate semiconductor device of claim 1, wherein a bottom surface of the gate protection-region is shallower than a bottom surface of the base-contact region.

* * * * *